(12) United States Patent
Sommer

(10) Patent No.: US 7,961,514 B2
(45) Date of Patent: Jun. 14, 2011

(54) SEMICONDUCTOR DEVICE, A METHOD OF USING A SEMICONDUCTOR DEVICE, A PROGRAMMABLE MEMORY DEVICE, AND METHOD OF PRODUCING A SEMICONDUCTOR DEVICE

(75) Inventor: Michael Bernhard Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 337 days.

(21) Appl. No.: 12/349,694

(22) Filed: Jan. 7, 2009

(65) Prior Publication Data
US 2010/0172176 A1 Jul. 8, 2010

(51) Int. Cl.
*G11C 16/04* (2006.01)
(52) U.S. Cl. .................................................. 365/185.05
(58) Field of Classification Search .............. 365/185.05
See application file for complete search history.

(56) References Cited

U.S. PATENT DOCUMENTS

| 5,278,439 | A | 1/1994 | Ma et al. |
| 6,143,606 | A | 11/2000 | Wang et al. |
| 6,304,484 | B1 | 10/2001 | Shin et al. |
| 6,531,732 | B2 * | 3/2003 | Sugita et al. ................ 257/315 |
| 2002/0055229 | A1 * | 5/2002 | Kanamori ...................... 438/257 |

* cited by examiner

*Primary Examiner* — Huan Hoang
*Assistant Examiner* — Anthan T Tran
(74) *Attorney, Agent, or Firm* — Slater & Matsil, L.L.P.

(57) ABSTRACT

A semiconductor device is described. A channel area is arranged in a semiconductor substrate between a first contact area and a second contact area. A first programmable structure includes a first control structure. The first programmable structure is arranged such that a conductivity of a first section of the channel area depends on a voltage applicable to the first control structure of the first programmable structure and on an information value stored in the first programmable structure. A second programmable structure includes a second control structure. The second programmable structure is arranged such that a conductivity of a second section of the channel area depends on a voltage applicable to the second control structure of the second programmable structure and on an information value stored in the second programmable structure. The first section and the second section of the channel area are electrically connected in series between the first contact area and the second contact area.

25 Claims, 33 Drawing Sheets

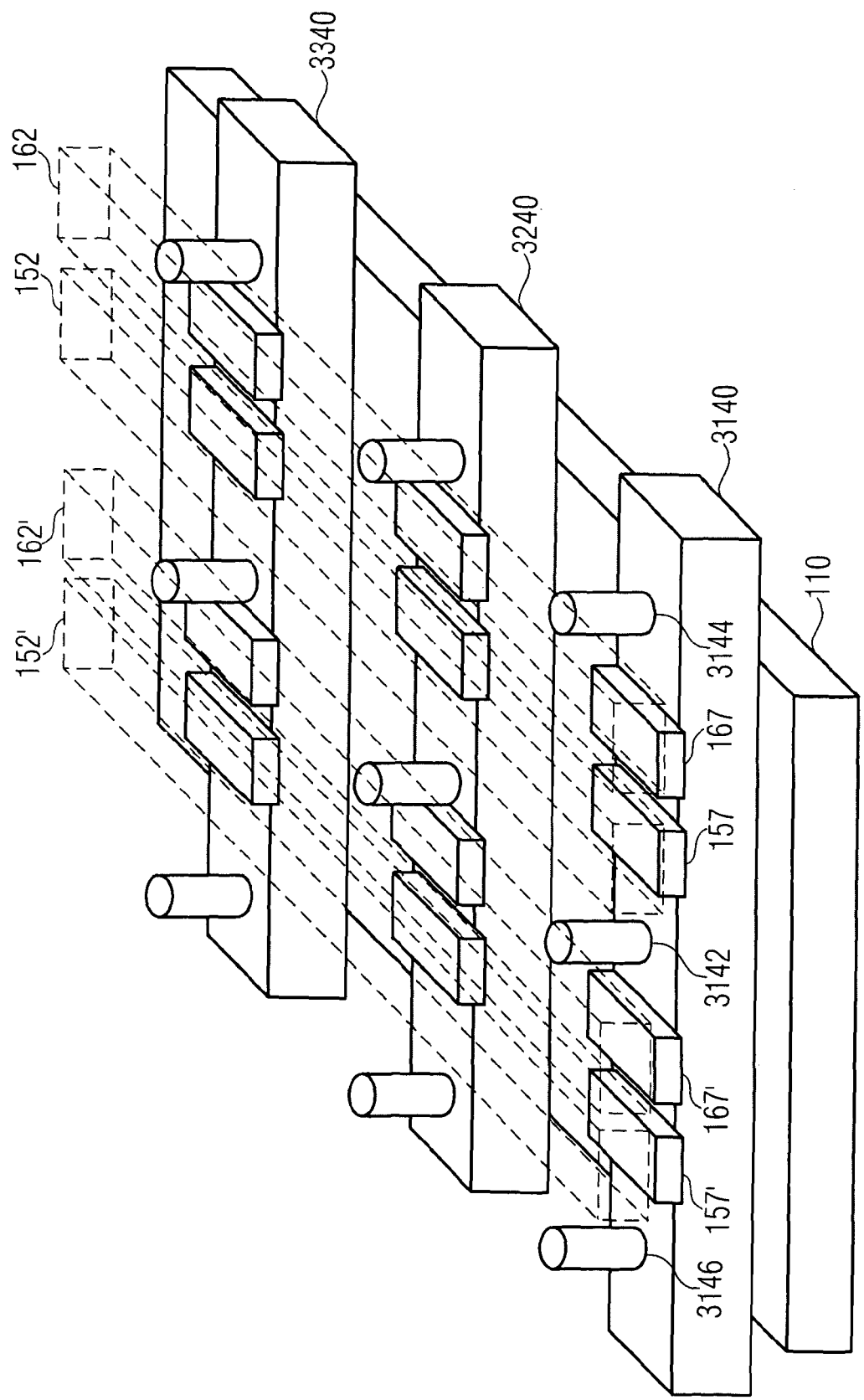

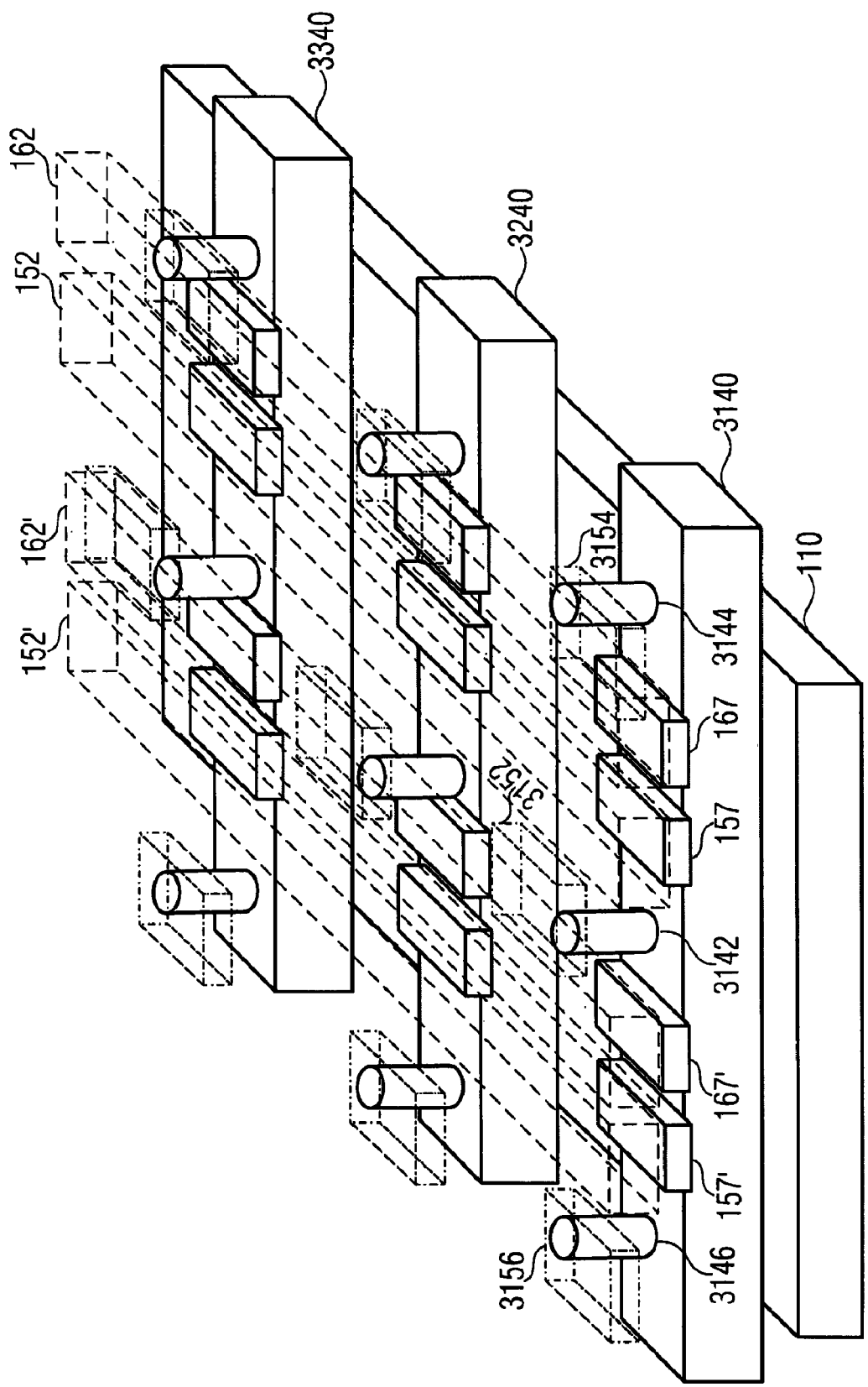

SEMICONDUCTOR DEVICE, A METHOD OF USING A SEMICONDUCTOR DEVICE, A PROGRAMMABLE MEMORY DEVICE, AND METHOD OF PRODUCING A SEMICONDUCTOR DEVICE

TECHNICAL FIELD

Embodiments of the present invention relate to semiconductor devices and methods of making and using semiconductor devices.

BACKGROUND

A non-volatile memory (NVM) or non-volatile storage is a computer memory that can retain the stored information even when not powered. Examples of a non-volatile memory include a read-only memory (ROM), a programmable read-only memory (PROM), an erasable programmable read-only memory (EPROM), an electrically erasable programmable read-only memory (EEPROM) and/or flash memories. PROMs are typically only once programmable, whereas EPROMs can be programmed and erased several times. The "programming" is also referred to as writing information to the memory or storing information in the memory. Prior to programming, the EPROMs are typically erased. The term "erased" is also referred to as deleting the information stored in the EPROM. Among the EPROMs, there are different classes of technology, for example, ultraviolet erasable PROMs or electrically erasable PROMs. In both technologies, an electrical charge is trapped when programming the EPROM. However, for ultraviolet (UV) erasable PROMs (UV EPROM), the trapped charge is removed by applying an ultraviolet light for a certain period, returning the entire memory to its original "blank" or in other words uncharged state. Electrically erasable PROMs have the advantage of being able to selectively erase any part of the memory without the need to erase the entire memory. Similar to the UV EPROMs, the trapped charges are released so that the selected part, for example, a single cell of the memory, returns to its original blank or uncharged state.

It is desirable to reduce the area or surface consumption of such programmable read-only memories.

SUMMARY OF THE INVENTION

Embodiments of the invention provide a semiconductor device, comprising: a channel area arranged in a semiconductor substrate between a first contact area and a second contact area; a first programmable structure comprising a first control structure, the first programmable structure being arranged such that a conductivity of a first section of the channel area depends on a voltage applicable to the first control structure of the first programmable structure and on an information value stored in the first programmable structure; and a second programmable structure comprising a second control structure, the second programmable structure being arranged such that a conductivity of a second section of the channel area depends on a voltage applicable to the second control structure of the second programmable structure and on an information value stored in the second programmable structure, wherein the first section and the second section of the channel area are electrically connected in series between the first contact area and the second contact area.

A further embodiment of the invention provides a method of producing a semiconductor device, comprising: providing a semiconductor device; producing a first contact area and a second contact area and a channel area arranged in the semiconductor substrate between the first contact area and the second contact area; producing a first programmable structure comprising a first control structure, the first programmable structure being arranged such that a conductivity of a first section of the channel area depends on a voltage applicable to the first control structure of the first programmable structure and on a charge value stored in the first programmable structure; and producing a second programmable structure comprising a second control structure, the second programmable structure being arranged such that a conductivity of a second section of the channel area depends on a voltage applicable to the second control structure of the second programmable structure and on a charge value stored in the second programmable structure, and wherein the first section and the second section are electrically connected in series between the first contact area and the second contact area.

Embodiments of the invention enable designing surface-area optimized and economic programmable read-only memory architectures, by, for example, reducing the number of drain or source contacts per bit. Further embodiments enable to divide the number of drain and source contacts in half compared to conventional two-transistor EEPROM architectures or known unified channel programming (UCP) architectures.

BRIEF DESCRIPTION OF THE DRAWINGS

Embodiments will be described hereinafter, making reference to the appended drawings.

FIG. 2O shows a schematic diagram of an embodiment of a semiconductor device according to FIG. 1A or 1D comprising a two-well structure;

FIGS. 3A-3F show intermediate and final structures of a programmable device comprising a plurality of semiconductor devices;

Figure 1A:
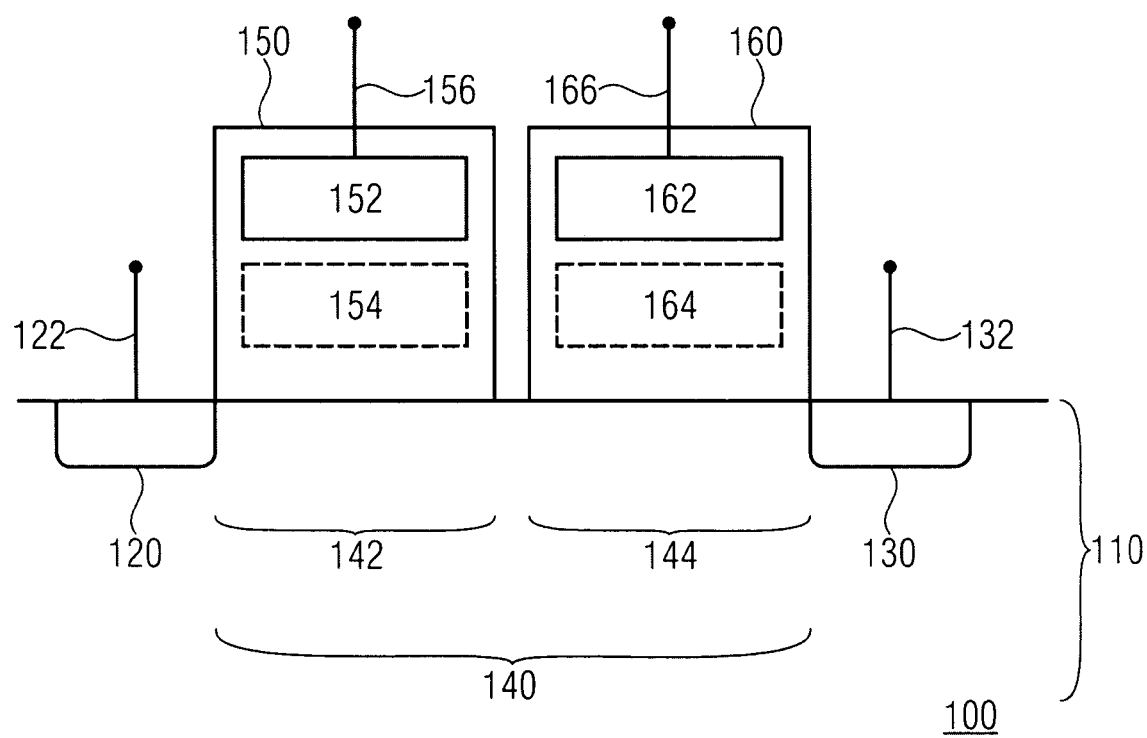
FIG. 1A shows a cross-section of an embodiment of a semiconductor device.

Equal or equivalent elements or elements with equal or equivalent functionality are denoted in the following description of the figures by equal or equivalent reference numerals.

DETAILED DESCRIPTION OF ILLUSTRATIVE EMBODIMENTS

FIG. 1A shows a schematic cross-section of an embodiment of a semiconductor device 100, the semiconductor device 100 comprising: a semiconductor substrate 110, a first contact area 120, a second contact area 130, a channel area 140, a first programmable structure 150 and a second programmable structure 160.

In the embodiment according to FIG. 1A, the first contact area 120 and the second contact area 130 are arranged in the semiconductor substrate 110, and the channel area 140 is arranged in the semiconductor substrate between the first contact area 120 and the second contact area 130.

The first programmable structure 150 comprises a first control structure 152 and is arranged such that a conductivity of a first section 142 of the channel area 140 depends on a voltage applicable to the first control structure 152 of the first programmable structure 150 and on an information value 154 (see hashed lines) stored in the first programmable structure 150.

The second programmable structure 160 comprises a second control structure 162 and is arranged such that a conductivity of a second section 144 of the channel area 140 depends on a voltage applicable to the second control structure 162 of the second programmable structure 160 and on an information value 164 stored in the second programmable structure 160.

The first section 142 and the second section 144 of the channel area 140 are electrically connected in series between the first contact area 120 and the second contact area 130, wherein the first section 142 is electrically connected to the first contact area 120 and the second section 144 is electrically connected to the second contact area 130.

The first contact area 120 and the second contact area 130 can be implemented as n+-wells and the channel area as p-doped area. The electrical connection between the first contact area 120 and the first section 142 can be realized by arranging the first contact area 120 and the first section 142 adjacent to each other, thus forming a pn-junction at the borderline between the first contact area 120 and the first section 142. The same applies for the electrical connection between the second contact area 130 and the second section 144. The electrical connection between the first section 142 and the second section 144 can be realized by arranging both sections directly adjacent to each other or by other means, for example, electrically conductive intersections between the first section 142 and the second section 144.

In other words, embodiments of the semiconductor device according to FIG. 1A realize a two-transistor structure comprising two programmable transistors connected in series between a first signal terminal 120 and a second signal terminal 130, where the first section 142 can be regarded as the channel area of the first programmable transistor 150 and the second section 144 can be regarded as the channel area of the second programmable transistor 160, and wherein the first control structure 152 forms a first control gate 152 of the first programmable transistor 150 and the second control structure 162 forms a second control gate 162 of the second programmable transistor 160.

Embodiments of the semiconductor device 100 or two-programmable transistor structure 100 may comprise enhancement mode transistors structures or depletion mode transistor structures, and/or n-channel or p-channel transistor structures.

The first contact area 120, the second contact area 130, the first control structure 152 and the second control structure 162 are connectable to signal sources or signal sinks, for example, voltage levels.

In embodiments comprising read lines 122 and 132 for reading the information values stored in the programmable structures, the first contact area 120 can be connected to a first read line and the second contact area 130 to a second read line, the first and second read line being electrically insulated from each other.

In embodiments comprising control lines 156 and 166 for controlling the conductivity of the sections of the channel area, the first control structure 152 can be connected to a first control line 156 and the second control structure 162 to a second control line 166.

In further embodiments comprising bit lines (BL) as read lines and word lines (WL) as control lines, the first contact area 120 can be connected to a first bit line, the second contact area 130 to a second bit line, the first control structure 152 to a first word line 156 and the second control structure 162 to a second word line 166.

Embodiments of the semiconductor device may comprise a first control structure 152 that is connectable to a different voltage or voltage level than the second control structure 162, for example, the first control structure 152 via the first word line 156 and the second control structure 162 via a second word line 166, which are electrically insulated from each other to apply different voltage levels to the first and second control structures.

In a similar way, embodiments of the semiconductor device can comprise a first contact area 120, which is connectable to a different voltage than the second contact area 130, for example, the first contact area 120 via the first bit line 122 and the second contact area 130 via the second bit line 132, wherein the first bit line 122 and the second bit line 132 are electrically insulated from each other to provide the different voltages to the first contact area 120 and the second contact area 130.

Embodiments of the semiconductor device according to FIG. 1A can comprise different types of programmable structures, or in other words different programmable read-only memory technologies. Typically, the programmable structures of embodiments of the semiconductor device comprise a means for trapping electrical charge in the sense that this electrical charge is kept at these trapping means even in case no power is supplied to the programmable structures 150, 160. Typical programmable structures comprise floating gate programmable structures and charge trap programmable structures in the narrower sense, using nitride structures to trap the charge.

Figure 1B:
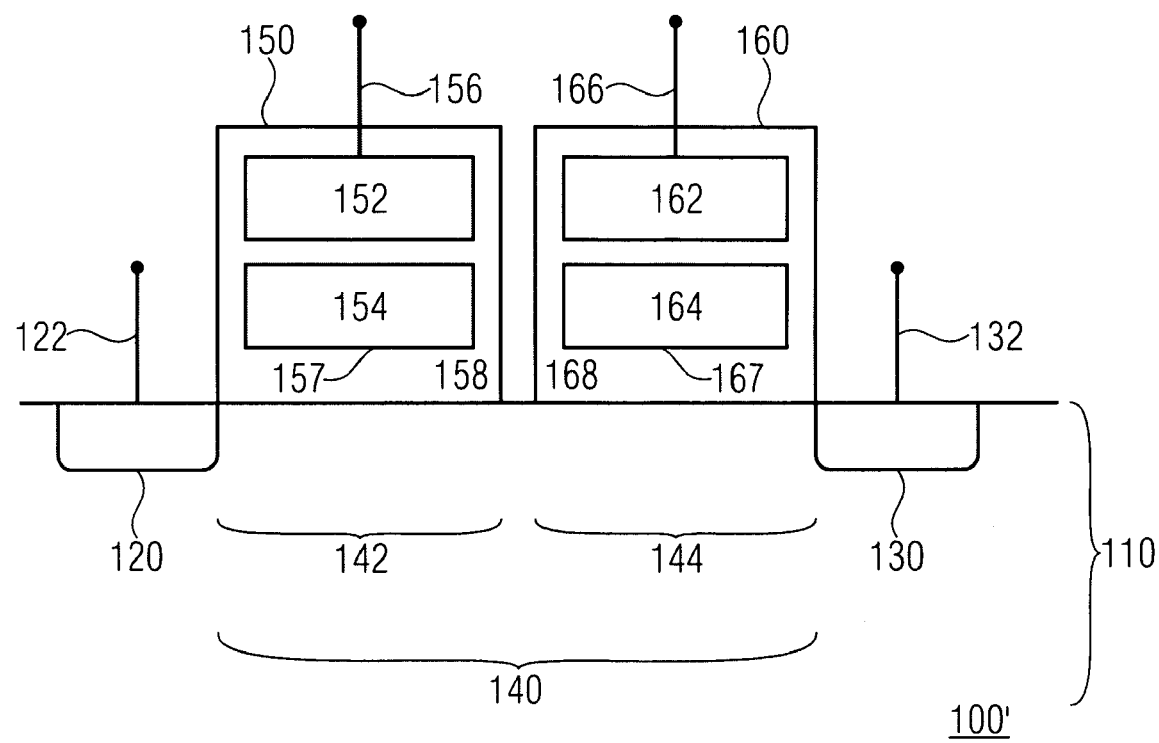
FIG. 1B shows an embodiment of a semiconductor device according to FIG. 1A with programmable structures comprising a floating gate.

FIG. 1B shows an embodiment of a semiconductor device 100' according to FIG. 1A, comprising a first floating gate programmable structure 150 comprising a first floating gate 157 to store the information value in the first programmable structure 150, a first insulating structure 158, a second floating gate programmable structure 160 comprising a second floating gate 167 to store the information value in the second programmable structure 160 and a second insulating structure 168. The first floating gate 157 and the second floating gate 167 are floating in the sense that they are not connected or connectable to a predetermined voltage, for example, applied "externally". Information is stored in the floating gate programmable structures 150, 160 by either charging the floating gate with a positive or negative electrical charge, for example, by tunneling electrons through the first insulation structure 158 arranged between the first floating gate 157 and the first contact area 120 and the first section 142, and through the second insulation structure 168 arranged between the second floating gate 167 and the second section 144 and/or the second contact area 130. This step of "charging" is also referred to as "programming" or "writing", and the programmable structures 150, 160 after "charging" are also referred to as "programmed programmable structures" or described as programmable structures 150, 160 in a "programmed state". Programmable structures 150, 160 comprising floating gates 157, 167 that are not charged are also referred to as "erased programmable structures" 150, 160 or described as programmable structures 150, 160 in an "erased state". Thus, one can distinguish between programmable memory structures 150, 160 in an "erased state" or in other words storing a first information value, whereas programmable memory structures 150, 160 in a "programmed state" store a second information value, the second information value being different from the first information value.

In other words, the first programmable structure 150 and the second programmable structure 160 can be programmable structures adapted to store an electrical charge, wherein an electrical charge with a magnitude below a given charge threshold corresponds to a first information value, and wherein an electrical charge with a magnitude above the given charge threshold corresponds to a second information value.

The first floating gate 157 and the second floating gate 167 are brought back into an "uncharged state", or in other words are erased or set to the first information value, by tunneling the electrons back or in a reverse direction compared to the programming step.

Alternative embodiments of the programmable structures 150, 160 are adapted to store, instead of a negative charge as explained above, a positive charge on the floating gates 157 and 167 during the step of "programming" and discharging a positive charge during the step of "erasing". Therefore, programming embodiments storing negative charges comprises, for example, tunneling electrons from the channel to the floating gate, and erasing such embodiments comprises tunneling electrons back from the floating gate to the channel. Accordingly, programming embodiments storing "positive charges" comprises, for example, transporting positive charge carriers, e.g., holes, from the channel to the floating gate, and erasing such embodiments comprises transporting such positive charge carriers back from the floating gate to the channel, wherein the transport of the positive charge carriers is performed, for example, by tunneling electrons in the reverse directions with regard to the flow of the positive charge carriers, e.g. hole flow.

Therefore, the conductivity of the first section 142 does not only depend on, for example, whether an enhancement mode or a depletion mode structure is used or what voltage level is supplied to the first control structure 152, but also on the information value 154 stored in the first programmable structure 150, or in other words whether an electrical charge corresponding to a first information value or a second information value is stored in the floating gate 157. The same applies to the second programmable structure 160.

Figure 1C:
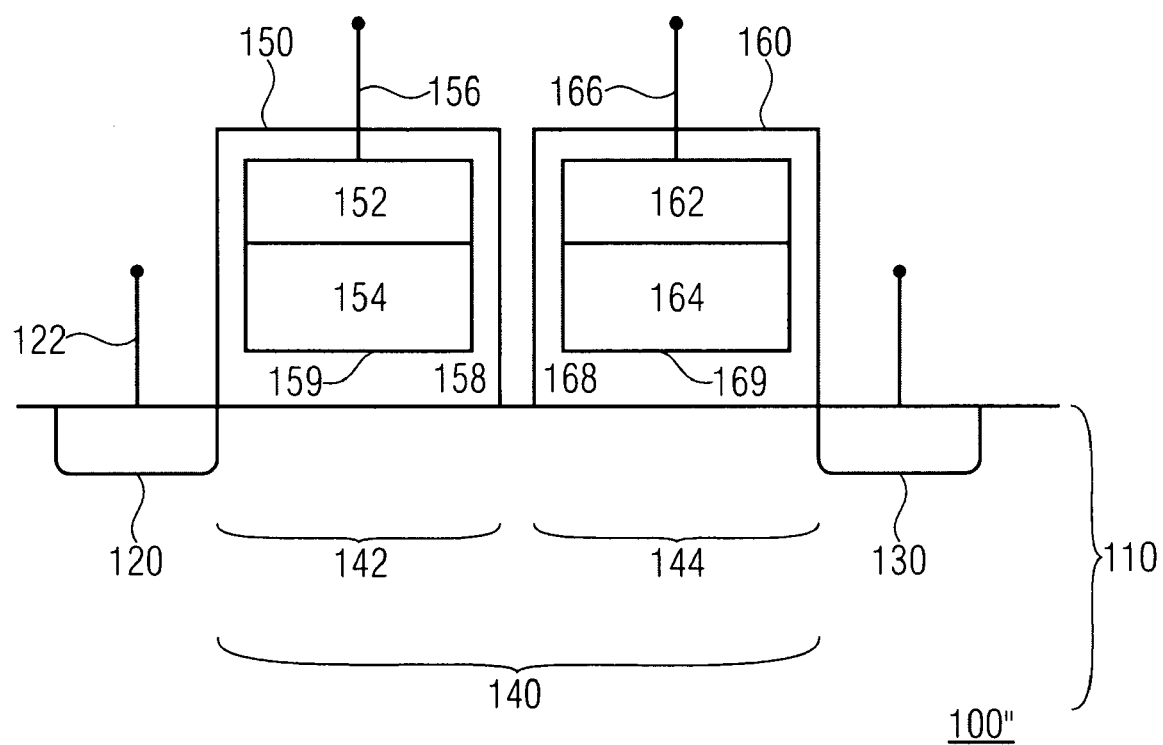
FIG. 1C shows an embodiment of a semiconductor device according to FIG. 1A with programmable structures comprising nitride traps.

FIG. 1C shows a schematic cross-section of an embodiment of a semiconductor device 100" comprising a first charge-trapping nitride programmable structure 150 and a second charge-trapping nitride programmable structure 160. The first charge-trapping nitride programmable structure 150 comprises a control structure 152, a charge-trapping nitride structure 159 and an insulating structure 158 insulating the charge-trapping nitride structure 159 from the first section 142. The second charge-trapping nitride programmable structure 160 comprises a control structure 162, a second charge-trapping nitride structure 169 for storing the information value in the second programmable structure 160, and a second insulating structure 168 electrically insulating the charge-trapping nitride structure 169 from the second section 144. The use of the charge-trapping nitride structures 159, 169 is an alternative to the floating gate-based trapping of charge, wherein the charge is stored in discrete nitride traps and is also retained when no power is supplied to a semiconductor device. This technology is also referred to as metal nitride oxide silicon (MNOS).

The charge-trapping nitride structures 159, 169 are charged or erased by, for example, tunneling electrons through the insulating structures 158, 168 as already discussed with regard to a floating gate programmable structure in FIG. 1B. The same considerations with regard to "programming", "erasing" or a distinction between "first information values" and "second information values" apply accordingly.

Figure 1D:
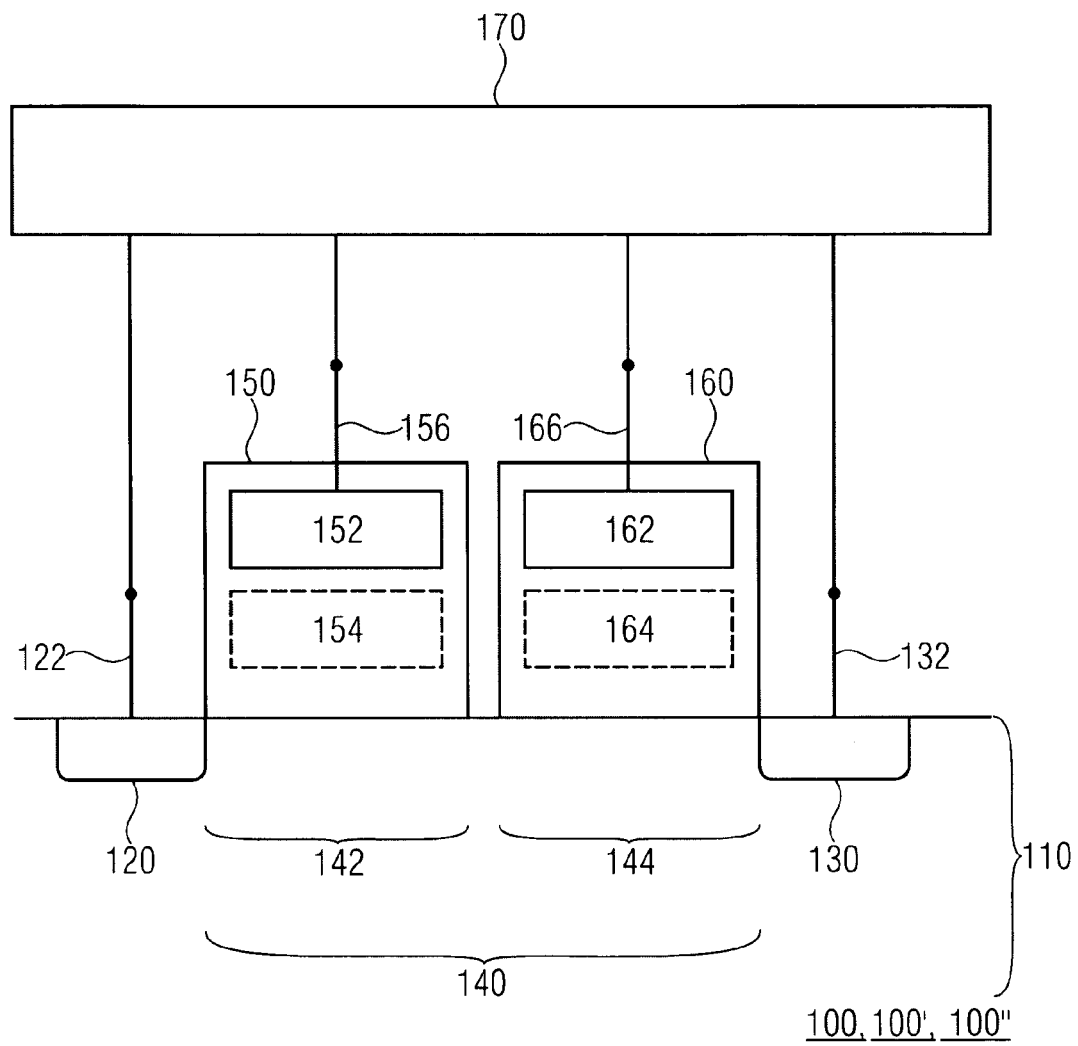
FIG. 1D shows a schematic drawing of an embodiment of a semiconductor device according to FIG. 1A comprising a controller.

FIG. 1D shows a schematic diagram of an embodiment of a semiconductor device 100, 100' or 100" according to one of the FIGS. 1A to 1C, comprising additionally a controller 170. The controller 170 or controlling unit 170 can be adapted, according to one aspect, to apply a voltage to the first control structure 152 and the second control structure 162 to apply a different voltage to the first control structure 152 and the second control structure 162, to apply a voltage to the first contact area 120 and the second contact area 130, to apply a different voltage to the first contact area 120 and the second contact area 130, and/or to apply voltages to the first control structure 152, the second control structure 162, the first contact area 120 and the second contact area 130 (last alternative shown in FIG. 1D). According to another aspect, the controller 170 can be a read controller adapted to apply voltages to the first control structure 152, the second control structure 162, the first contact area 120 and the second contact area 130 to read out an information value 154 or 164 stored in the first programmable structure 150 or second programmable structure 160. According to a second aspect, the controller 170 can be a write or program controller and/or an erase controller for applying the voltages to the first control structure 152, the second control structure 162, the first contact area 120, the second contact area 130, and/or the channel area 140 to write or program and/or erase the programmable structures 150, 160.

The channel area 140 can also be referred to as bulk area 140.

In further embodiments of the semiconductor device, the controller 170 can be adapted to read, program and erase the programmable structures 150, 160. The voltages to be applied to the first control structure 152, the second control structure 162, the first contact area 120, the second contact area 130 and the channel area 140 depend on the doping of the contact areas 120, 130 and the channel area 140, the transistor mode (depletion mode or enhancement mode), the "charge-trapping technology" used (e.g., floating gate or charge-trapping nitride), the type of programming used (e.g., Fowler-Nordheim tunneling), the type of erasing (ultraviolet erasure or electrical erasure) and the well-structure of the semiconductor device (for example, double well or triple well) and on whether positive of negative charge trapping is applied.

Embodiments of the programmable structures 150, 160 comprise one-time programmable first or second programmable structures 150, 160 or embodiments of a method for reading an information value of the first or second programmable structure that are one-time programmable read-only memories (one-time programmable ROM), erasable programmable read-only memories (EPROM), electrically erasable programmable read-only memories (EEPROM) and/or flash memories. One-time PROMs comprise programmable structures, which are only once programmable and not erasable. These embodiments comprise, for example, a program controller and read controller but no erase controller and are, thus, easier and cheaper to produce. EPROMs comprise programmable structures typically comprising a program and read controller 170, and, for example, apply ultraviolet radiation to erase the trapped charges. EEPROMs typically comprise a controller 170 adapted to program, erase and read the stored information values.

In the following, embodiments of the semiconductor device with a controller 170 for performing read operations or embodiments of methods for reading stored information values from the first and/or second programmable structures 150, 160 are described based on FIGS. 2A to 2L. These embodiments comprise n-channel enhancement type transistor structures and are based on writing negative charges to the charge-trapping means. In other words, a negative charge amount with a magnitude below a given threshold corresponds to the first information value and an electrical charge amount with a magnitude above the given threshold corresponds to the second information value.

The embodiments of the semiconductor device 200 according to FIGS. 2A to 2L comprise a sense amplifier 210 that can be connected to the first contact area 120 or second contact area 130 or the first bit line 122 or second bit line 132, respectively. The connection between the sense amplifier 210 and the bit lines 122, 132 and/or contact areas 120, 130 is controlled by the controller 170. The embodiments of the semiconductor device shown in FIGS. 2A to 2H comprise a sense amplifier 210 with a current source, whereas the embodiments of the semiconductor device shown in FIGS. 2I to 2L comprise a sense amplifier with a current sink.

Figure 2A:
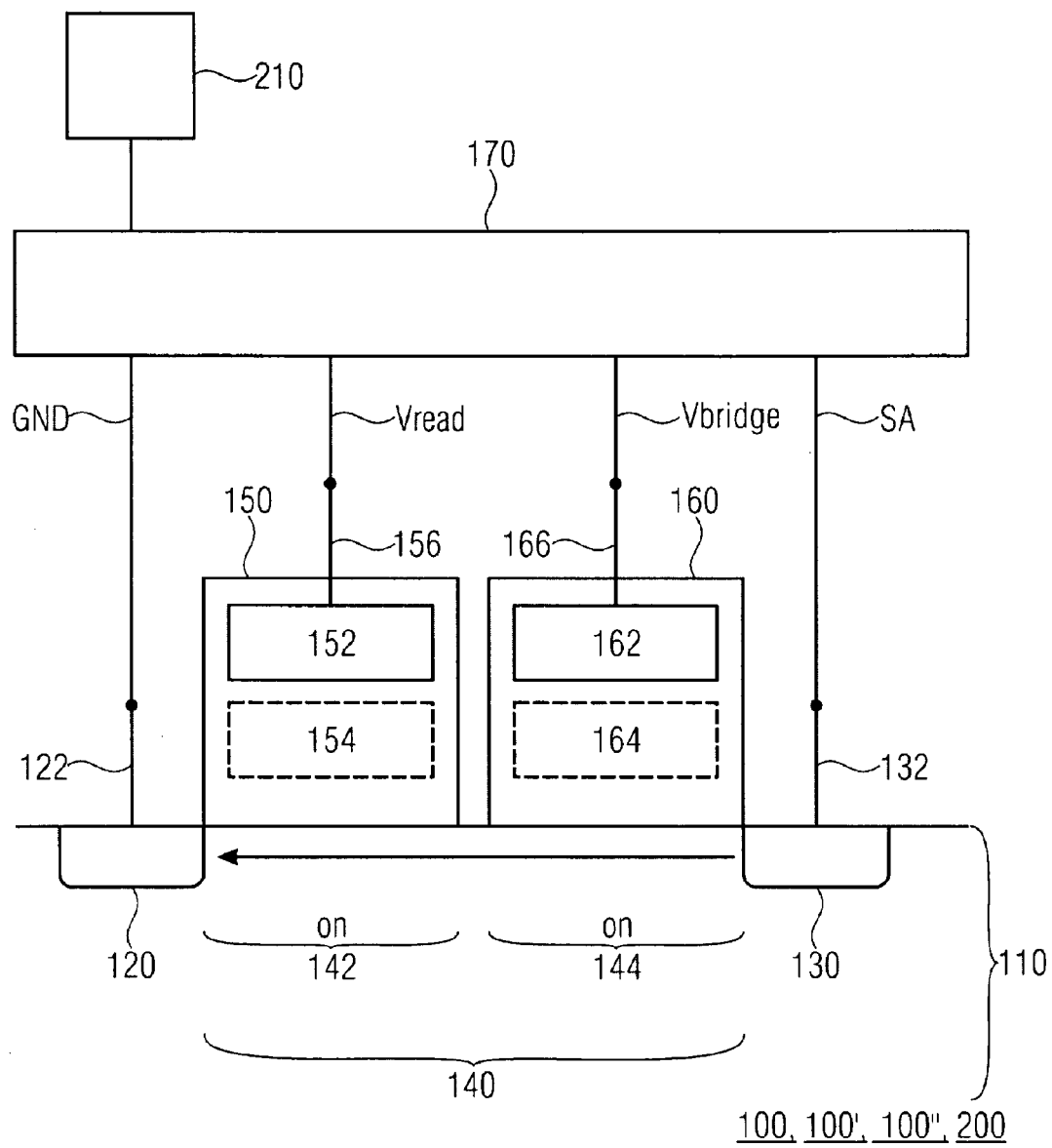
FIGS. 2A-2H show schematic drawings of embodiments of a semiconductor device according to FIG. 1D comprising a sense amplifier with a current source, FIGS. 2A-2H showing different embodiments for reading the information value stored in the first programmable structure or second programmable structure.

FIG. 2A shows an embodiment of a semiconductor device 200, wherein the programmable structure 150 stores a first information value, or in other words, an erased programmable structure 150. For reading the information value 154 stored in the first programmable structure 150, the controller 170 is adapted to apply a read voltage Vread to the first control structure 152, a bridge voltage Vbridge to the second control structure 162, a ground voltage GND to the first contact area, and to connect the current source of the sense amplifier 210 to the second contact area 130 (see reference SA in FIG. 2A). The bridge voltage Vbridge is defined such that the second section 144 is in a conductive state ("on" in FIG. 2A) irrespective of whether the first information value or the second information value is stored in the second programmable structure. In other words, bridge voltage Vbridge is large enough to "overforce" the electrical field generated by the stored information 164, i.e., to "bridge" the second programmable transistor independent of its program state. On the other hand, bridge voltage Vbridge is small enough to not cause an "erase" of the second programmable structure 160. As the first programmable structure is chargewise "neutral", the first section 142 would be in a blocking state without applying the read voltage Vread. Therefore, read voltage Vread is defined large enough to turn on the first programmable transistor structure 150, or in other words to set the first section 142 in a conductive state ("on"). As both programmable transistor structures 150, 160 are conductive, a current flows from the current source of the sense amplifier 210 via the second bit line 132, the second contact area 130, the second and first sections 144, 142, the first contact area 120 and the first bit line 122, and connects the second bit line 132 to ground. In other words, the voltage at the second bit line 132 or the second contact area 130 is pulled down below a voltage threshold. The sense amplifier 210 comprises a sense port connected to the second bit line 132, and recognizes that the voltage at the second bit line and the second contact area 130, respectively, is pulled below the voltage threshold, and, thus interprets the stored information 154 as first information value, for example, a logical "1".

Figure 2B:
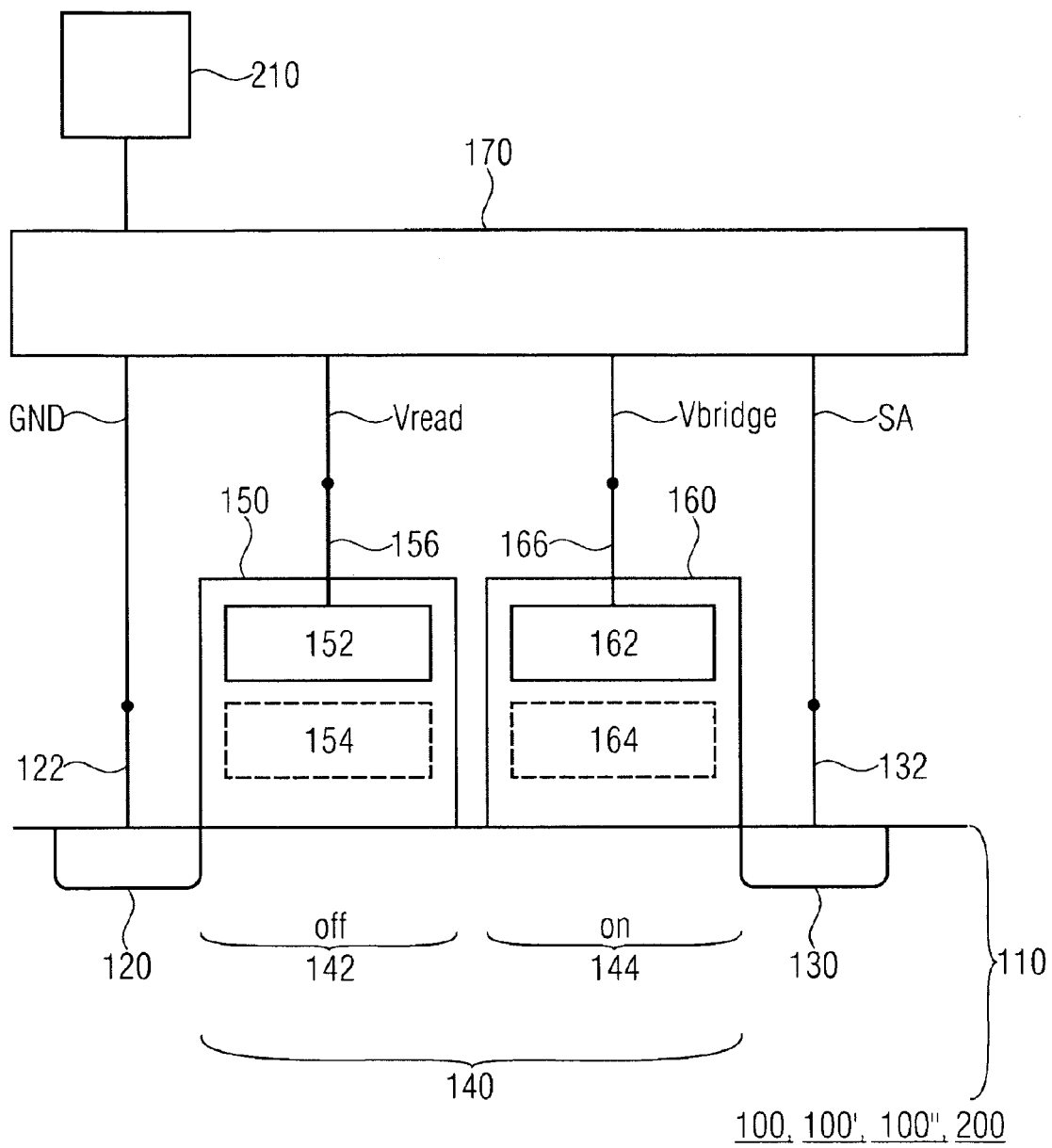

FIG. 2B shows a similar situation like in FIG. 2A, however, the embodiment of the semiconductor device of FIG. 2B stores a second information value, or in other words comprises a programmed programmable structure 150. The electrical field generated by the negative charge stored in the first programmable structure 150 sets the first section 142 in a blocked state. To distinguish the first and second information, erased and programmed state, respectively, a read voltage Vread is defined such that it does not (in contrast to bridge voltage Vbridge) overforce the electrical field generated by the negative charge stored in the first programmable structure.

In other words, with regard to the n-channel transistor structure, at the negative charge trapping embodiment, the read voltage is defined such that in case a first information value (erased) is stored in the first programmable structure 150, the read voltage Vread is high enough to set the first section in a conductive state, and in case a second information value (programmed) is stored in the first programmable structure 150, the read voltage Vread is small enough to retain the first section 142 in a blocking state.

In general, the read voltage is defined such that in case a first information value is stored in the first programmable structure, the first section is in a conductive state, and in case a second information value is stored in the first programmable structure 150, the first section is in a blocking state.

Figure 2C:
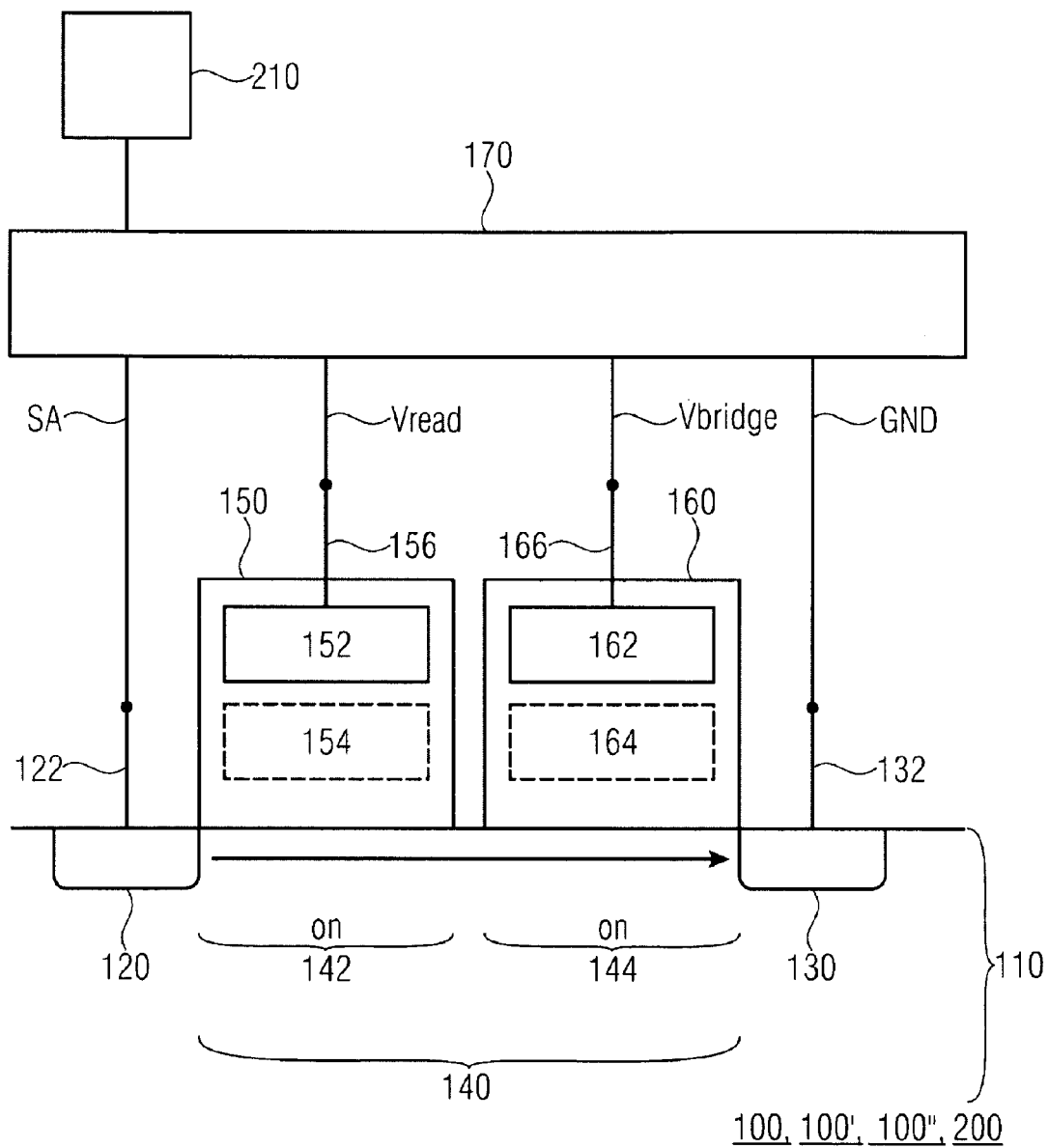
Figure 2D:
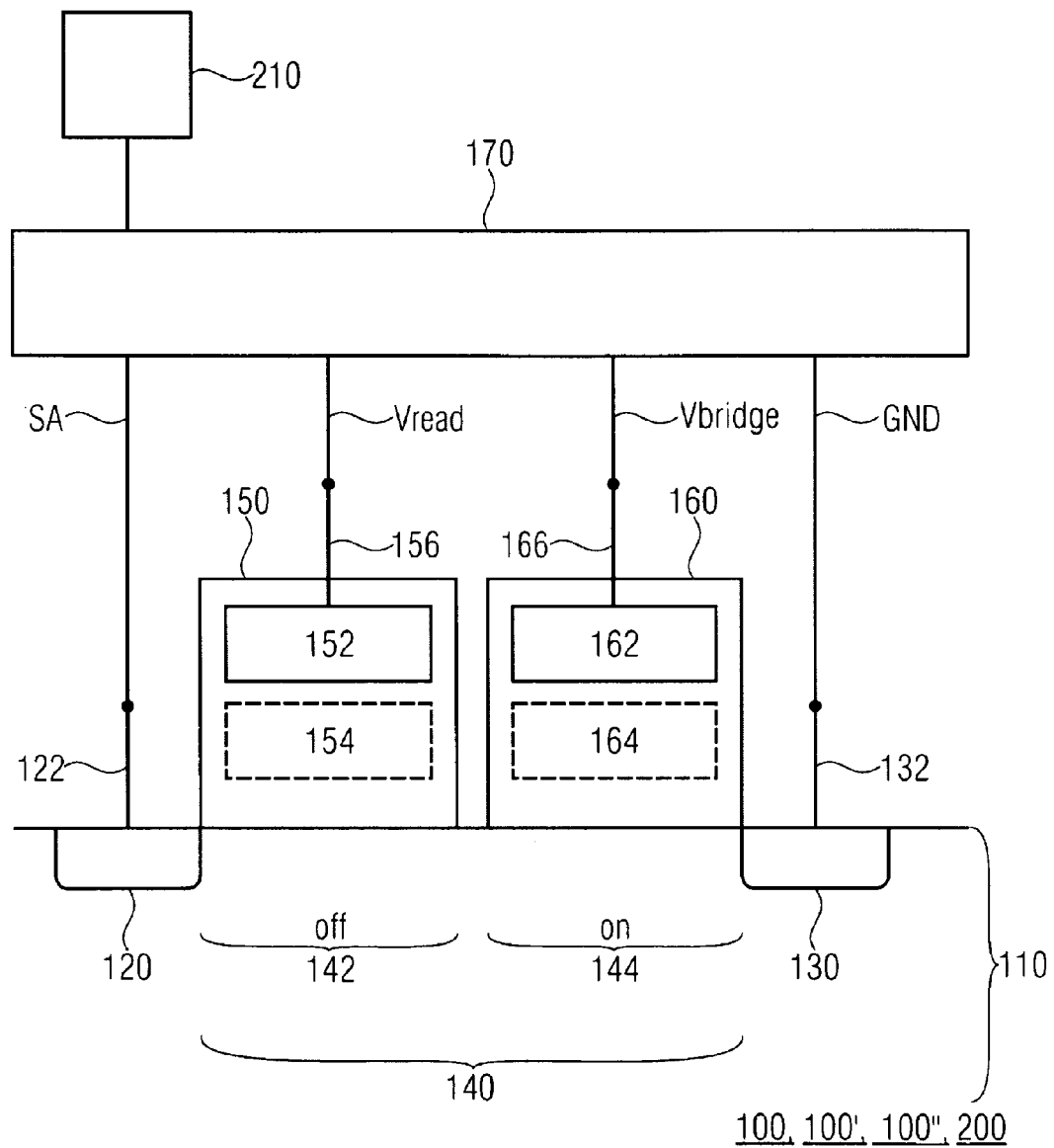

FIGS. 2C and 2D show an alternative embodiment of the semiconductor device with regard to FIGS. 2A and 2B. In contrast to FIGS. 2A and 2B, in FIGS. 2C and 2D, the first bit line 122 and the first contact area 120, respectively, are connected to the current source and the sense port of the sense amplifier 210, and the second bit line 132 and the second contact area 130, respectively, are connected to ground GND.

FIG. 2C shows an embodiment of the semiconductor device 200 with a first programmable structure 150 storing a first information value (erased). The same considerations apply with regard to read voltage Vread and bridge voltage Vbridge and the sense amplifier 210, as already explained based on FIG. 2A. Accordingly, the first section 142 and the second section 144 are conductive ("on"), and a current flows from the first contact area 120 to the second contact area 130 (see arrow in FIG. 2C in a reverse direction compared to the arrow in FIG. 2A). In this case, the first bit line 122 forms the "sense line" that is pulled down below the voltage threshold.

FIG. 2D shows an embodiment of the semiconductor device with a first programmable structure 150 storing a second information value (programmed). The same considerations apply as outlined with regard to FIGS. 2A and 2B. The first section 142 is blocked ("off"), the second section 144 is conductive ("on").

As the first section 142 is blocked, no current flows from the second contact area 130 to the first contact area 120. Accordingly, the second bit line 132 and the second contact area 130 are not pulled below the threshold but maintain a voltage above the threshold voltage. The sense port of the sense amplifier 210 connected to the second bit line 132 interprets this voltage above the threshold voltage as the second information value.

FIGS. 2E to 2H show embodiments of the semiconductor device for reading the information value stored in the second programmable structure 160. In contrast to FIGS. 2A to 2D, the bridge voltage Vbridge is now applied to the first control structure 152 and the read voltage Vread to the second control structure 162.

Figure 2E:
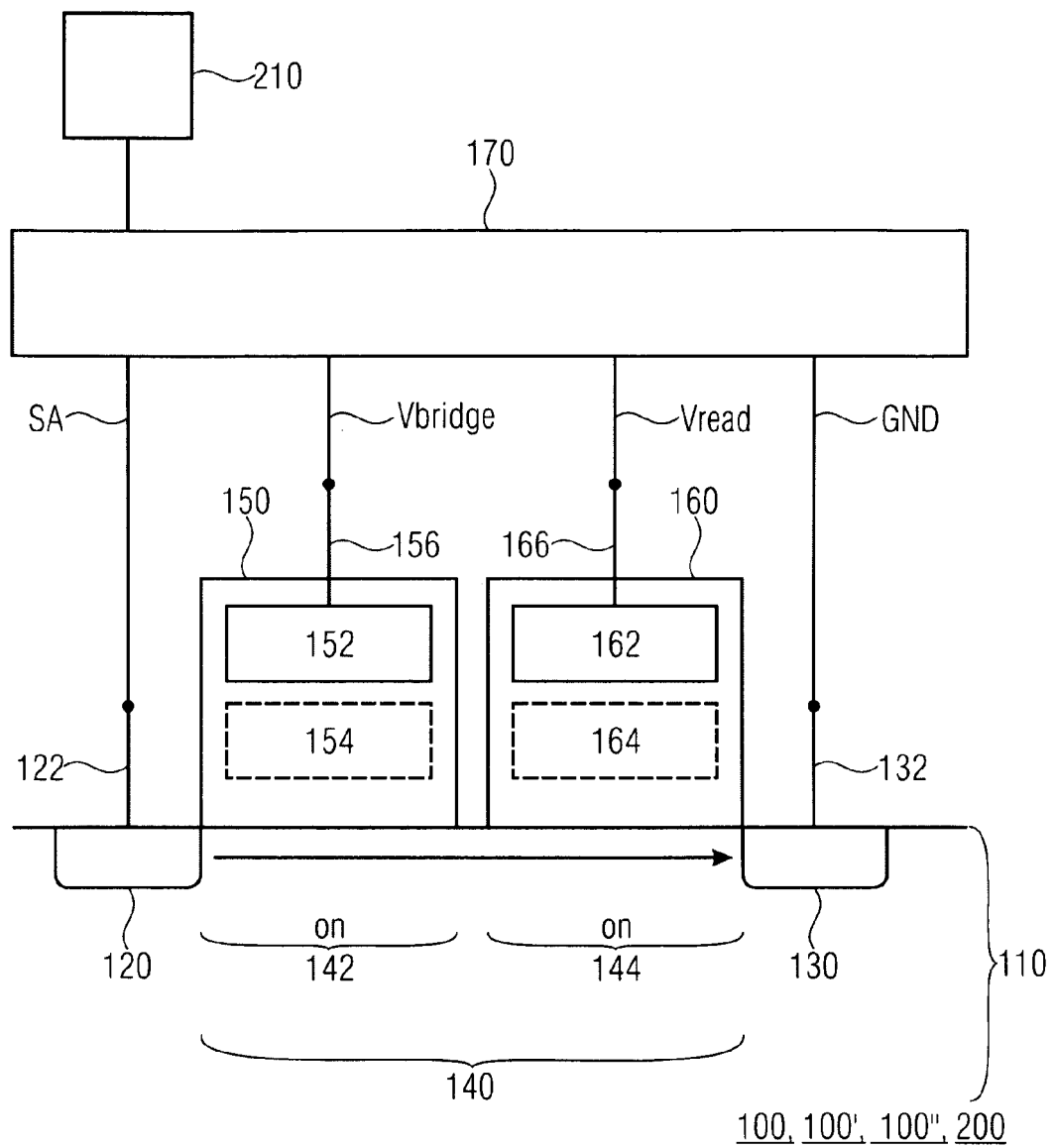
Figure 2F:
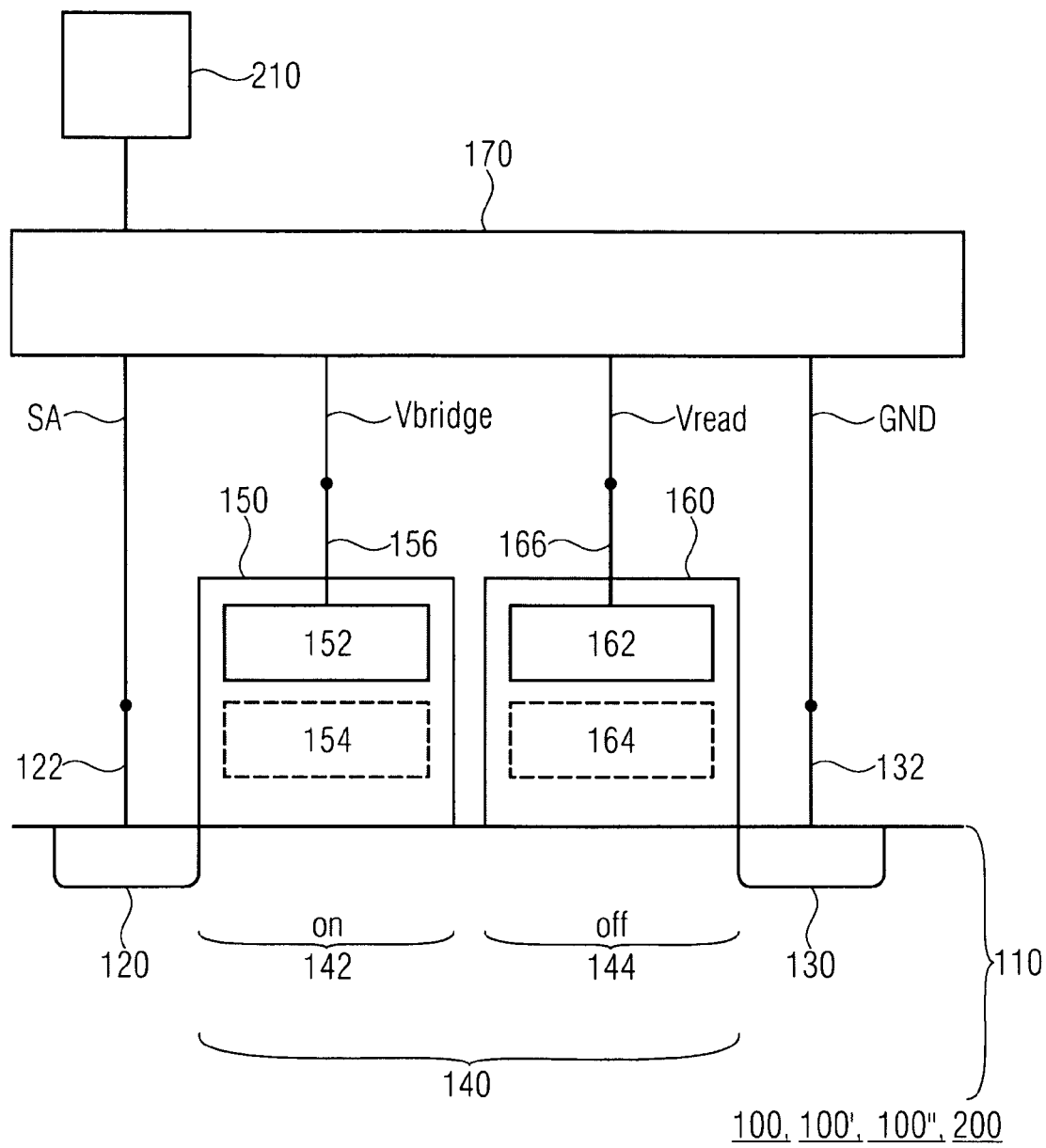

In FIGS. 2E and 2F, the first bit line 122 and first contact area 120 are connected to a sense amplifier 210 and the second bit line 132 and the second contact area 130 are connected to ground voltage GND. This corresponds to the way of applying the voltages to the bit lines as shown in FIGS. 2A and 2B. In other words, like in FIGS. 2A and 2B, the contact area on the side of the programmable structure to be read is connected to ground voltage GND and the voltage of the contact area on the opposite side of the channel area 140 is connected to the sense amplifier and is used as sense line for determining the stored information value. Thus, for example, embodiments of the semiconductor device comprise a controller that is adapted to symmetrically exchange the connections of the first and second contact area on one hand (i.e., exchange or switch the connections to the sense amplifier and to the ground voltage, compare FIGS. 2A and 2E) and to exchange the connections to the read voltage and the bridge voltage in the same manner on the other hand (i.e., exchange or switch the connections to the first and second control gate, compare FIGS. 2A and 2E). As the source contact area of the programmable structure to be read is connected to ground, a well defined voltage difference between the control structure of the programmable structure to be read and the corresponding source contact area can be achieved. Defining, furthermore, the bridge voltage such that the voltage difference between the control structure of the programmable structure to be bridged and the corresponding source area is higher than the threshold voltage, e.g., 100 mV higher than the threshold voltage, body-effects or the like can be neglected.

FIG. 2E shows an embodiment comparable to FIG. 2A, wherein the second programmable structure 160 stores a first information value (erased). Accordingly, both sections 142, 144 are conductive ("on"), and a current flows from the first contact area 120 to the second contact area 130. The voltage at the first bit line 122 is pulled down below the voltage threshold and a first information value is read out from the semiconductor device.

FIG. 2F shows an embodiment of the semiconductor device comparable to FIG. 2B, wherein the second programmable structure 160 stores a second information value (programmed). The second section 144 is blocked ("off"), and no current flows from the first contact area 120 to the second contact area 130. Accordingly, the first bit line 122 maintains a voltage that is higher than the threshold voltage and a second information value is read out from the semiconductor device.

Figure 2G:
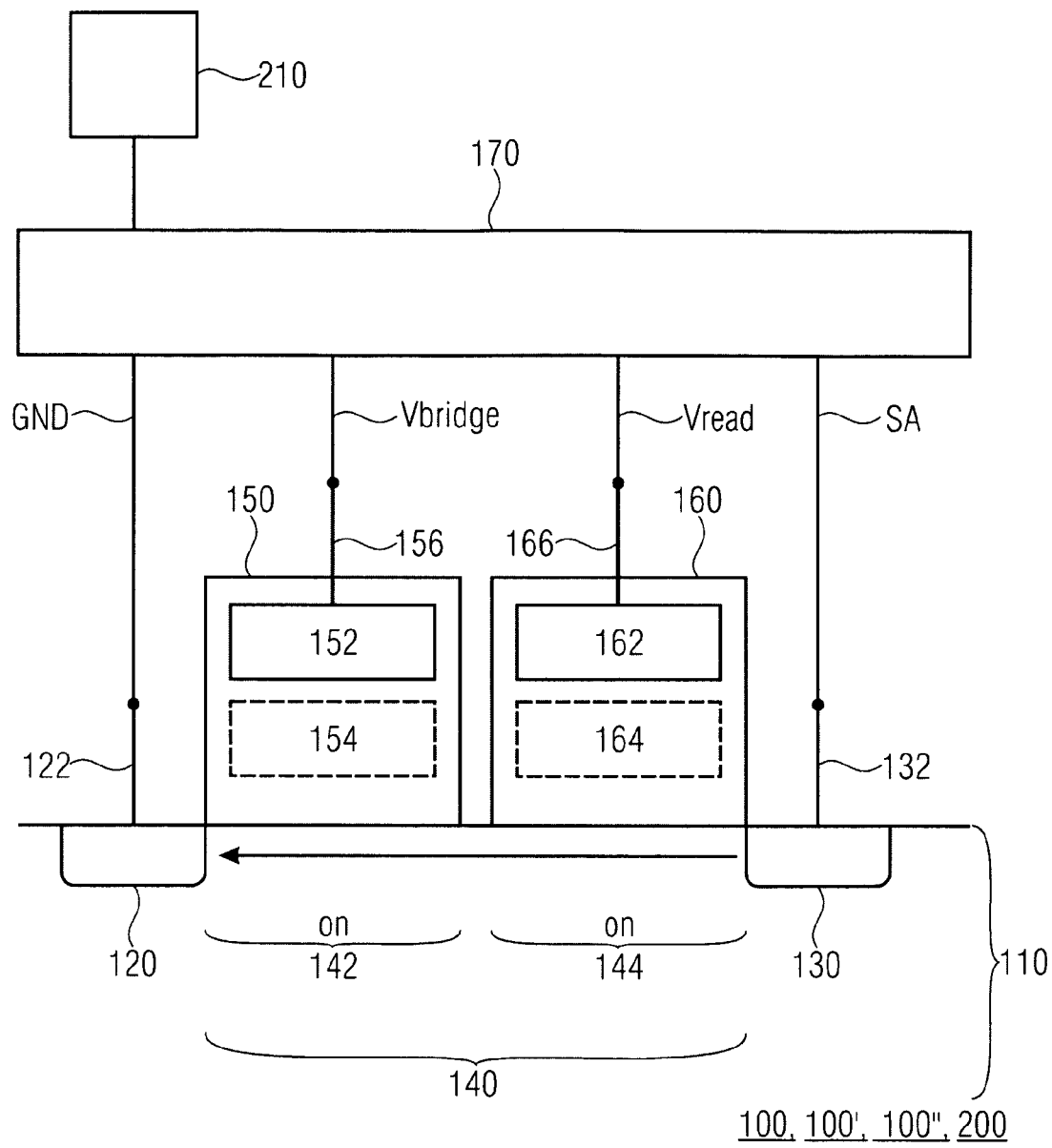
Figure 2H:
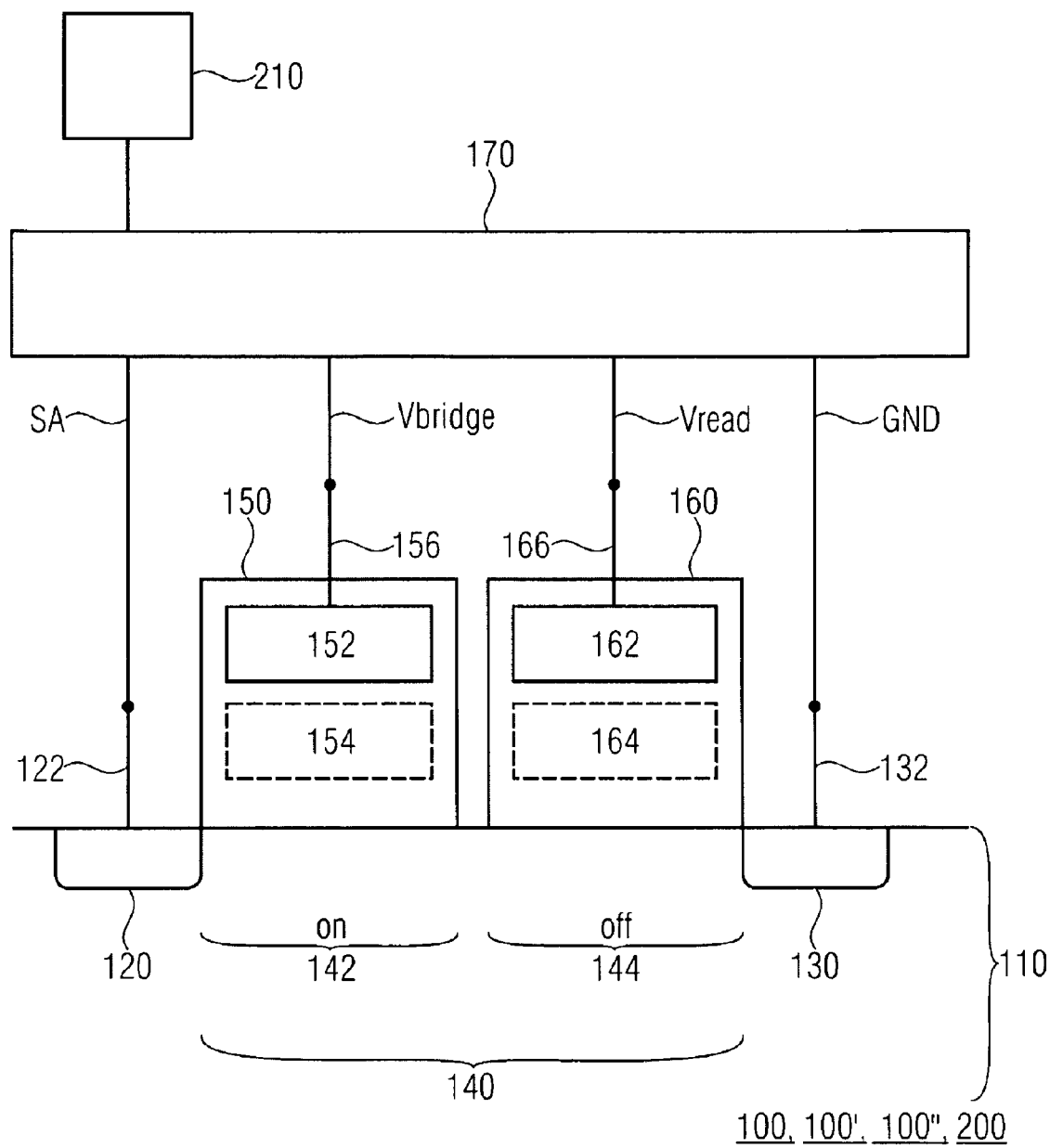

FIGS. 2G and 2H show embodiments of the semiconductor device comparable to the embodiments shown and discussed based on FIGS. 2C and 2D. In other words, the contact area on the side of the programmable structure to be read is connected to the sense amplifier, whereas the other structure on the opposite side of the channel area 140 is connected to the ground voltage GND.

FIG. 2G shows an embodiment of the semiconductor device storing a first information value (erased) in the second programmable structure 160. Both sections 142, 144 are conductive ("on"), and a current flows from the second contact area 130 to the first contact area 120. Accordingly, the voltage at the second bit line 132 is pulled down below a predefined or given threshold voltage and the corresponding first information value is read out from the second programmable structure 160 of the semiconductor device (comparable to FIG. 2C).

FIG. 2H shows an embodiment of a semiconductor device comparable to FIG. 2D, wherein the second programmable structure 160 stores a second information value (programmed). The second section 144 is blocked ("off"), and no current flows from the second contact area 130 to the first contact area 120. Accordingly, voltage at the second bit line 132 maintains a voltage above the given threshold voltage and a corresponding second information value is read out from the sense amplifier 210.

Depending on the role the first or second programmable structures 150, 160 play when reading an information value from one of the two programmable structures, the programmable structure from which the information value is to be read can also be referred to as "programmable structure to be read" and the other programmable structure as the "programmable structure to be bridged". When reading an information value, the read voltage Vread is applied to the programmable structure to be read and the bridge voltage Vbridge is applied to the programmable structure to be bridged. As explained previously, both programmable structures can be regarded as programmable transistor structures, wherein the control structures together with the stored information values form the gates, and wherein the first contact area 120 forms a first terminal of the two-programmable transistor structure 150, 160, the second contact area 130 forms a second terminal of the two-programmable transistor structure 150, 160, and wherein a possible intermediate area between the first section 142 and the second section 144 forms an intermediate terminal of the two-programmable transistor structure 150, 160.

Ranges for the different voltages are, for example, for the read voltage Vread 2.5 Volts to 3.8 Volts, typically 3.3 Volts, for the bridge voltage Vbridge 4 Volts to 5 Volts, and for the voltage generated by the current source of the sense amplifier, for example, 1.5 Volts as supply voltage (VDD). Thus, programmable structures to be bridged or "overforced" according to embodiments as shown in FIG. 2B, for example, do not see the full stress caused by the bridge voltage Vbridge applied to the control structure with regard to the ground voltage GND, but only a bridge voltage Vbridge reduced by the voltage supplied by the current source of the sense amplifier. Thus, the risk of unintentional erasing of the bridge programmable structure is reduced.

Figure 2I:
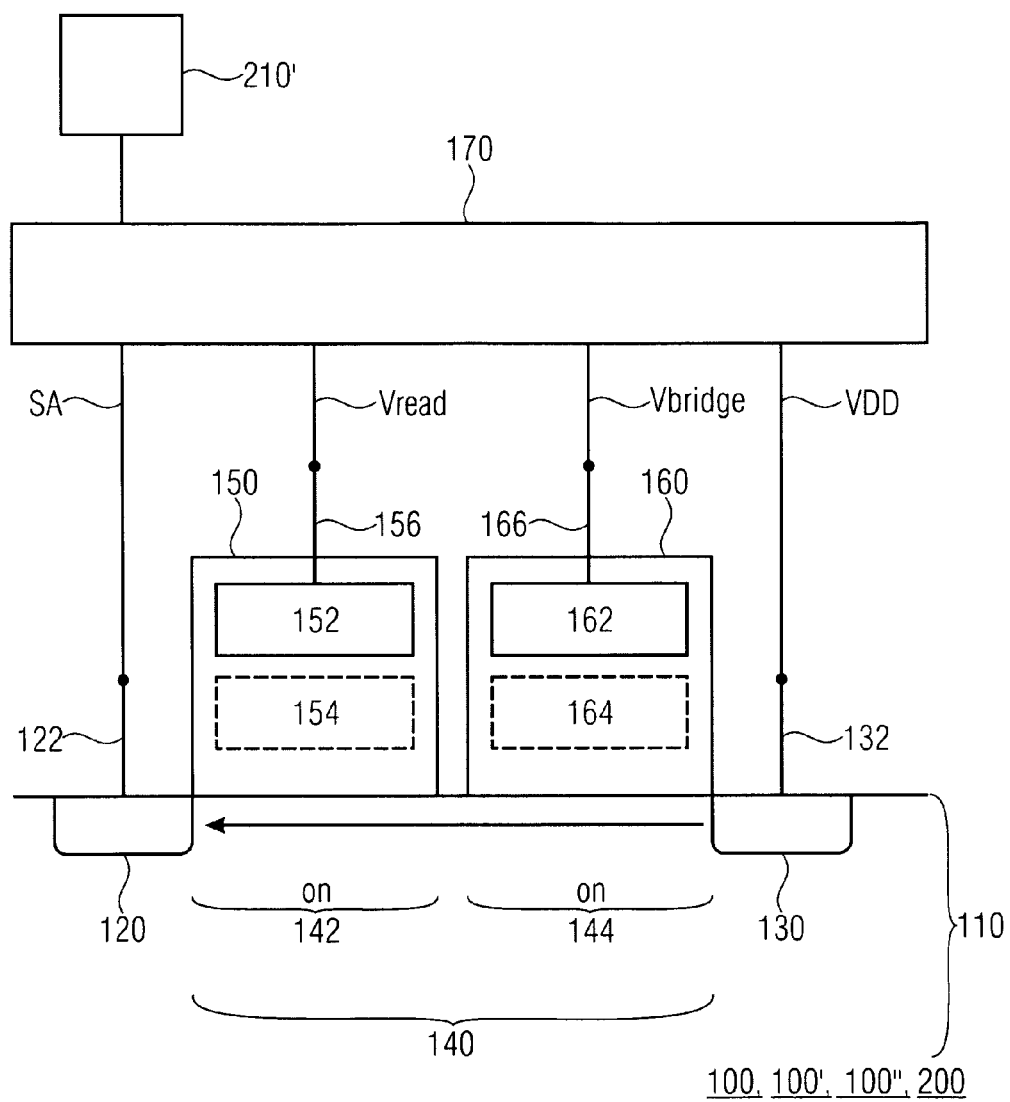
FIGS. 2I-2L show schematic drawings of embodiments of a semiconductor device according to FIG. 1D comprising a sense amplifier with a current sink, FIGS. 2I-2L showing different embodiments for reading the information value stored in the first programmable structure or second programmable structure.
Figure 2J:
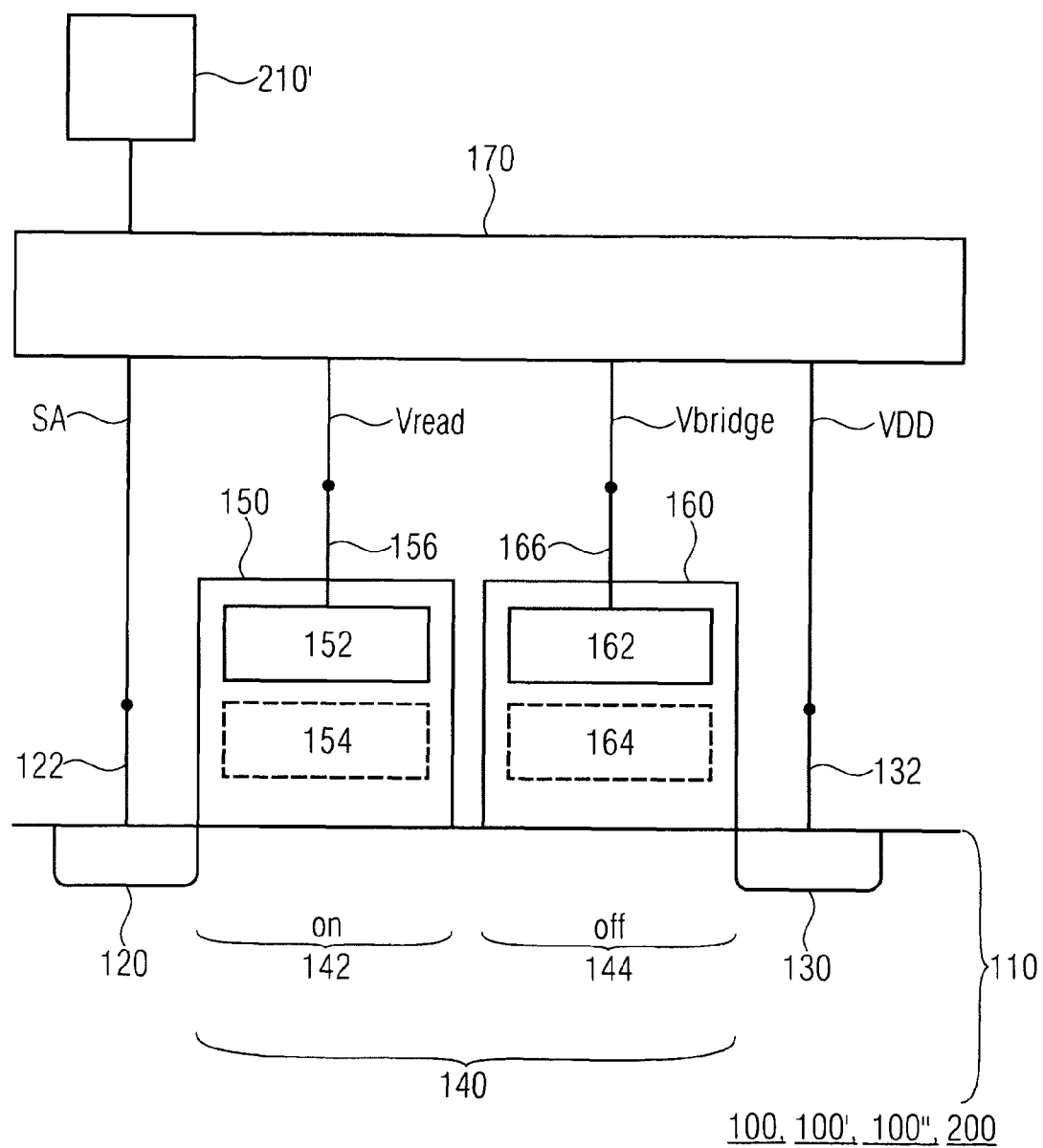
Figure 2K:
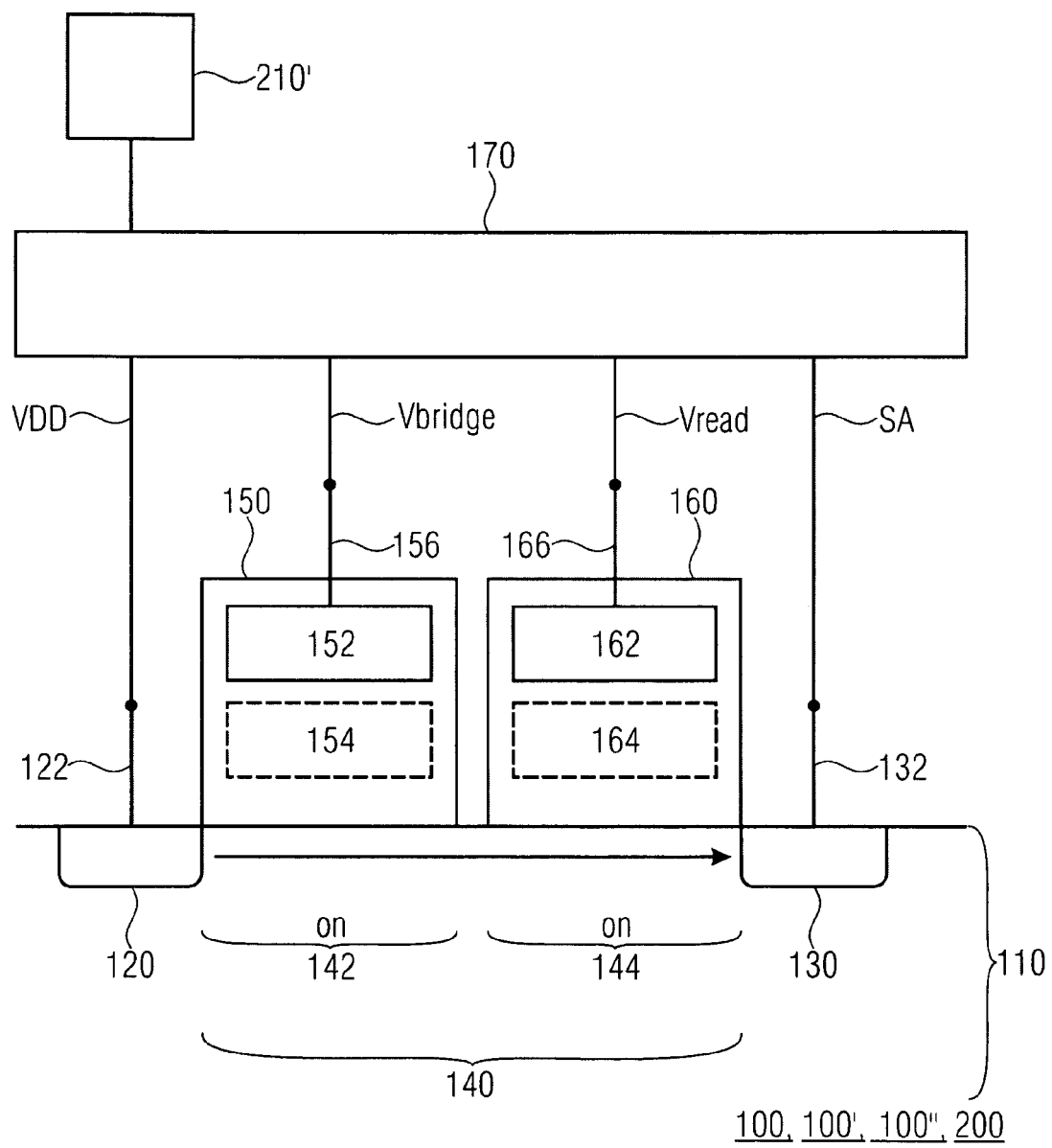
Figure 2L:
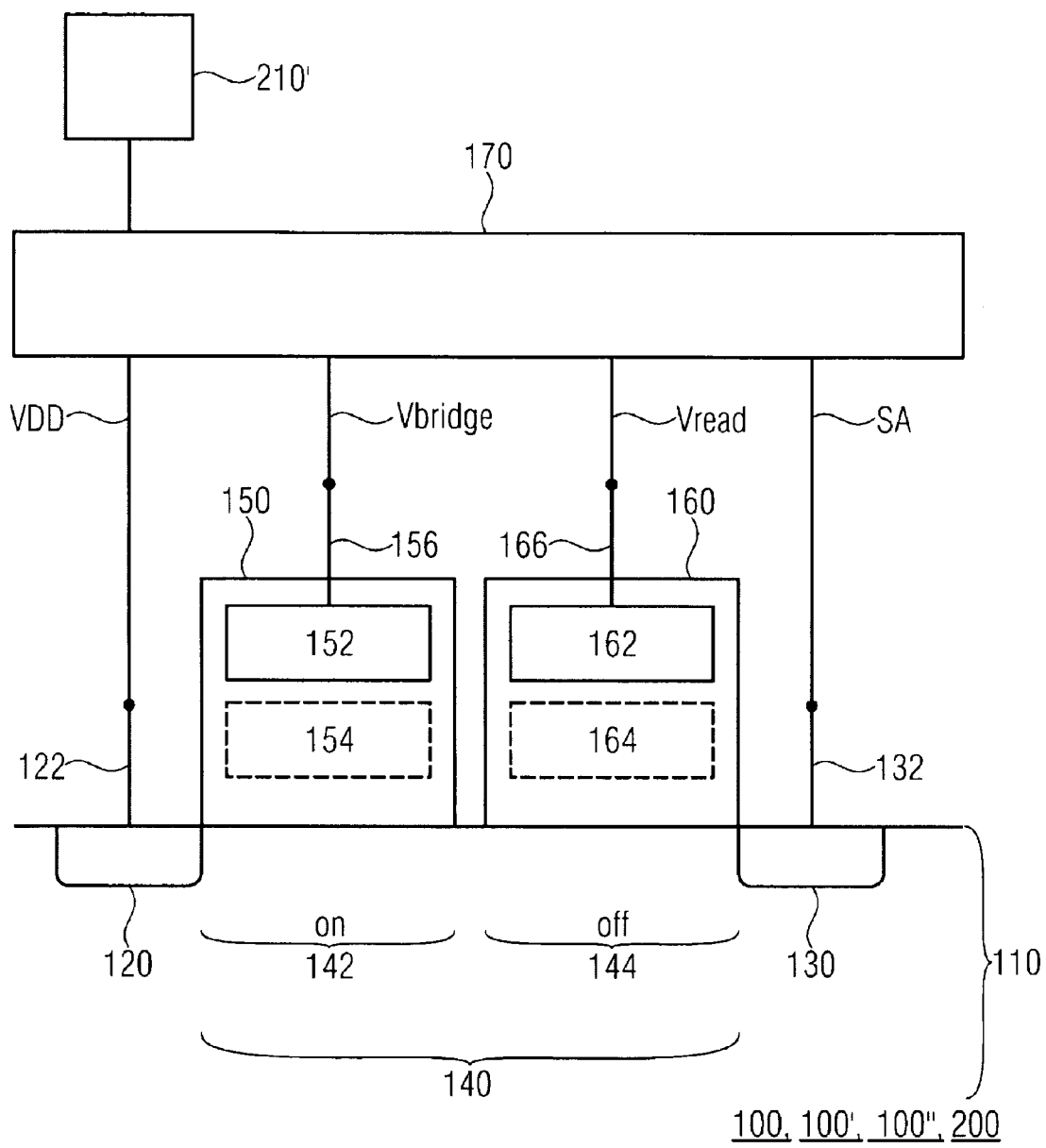

FIGS. 2I to 2L show embodiments of the semiconductor device comprising a sense amplifier 210' with a current sink. FIGS. 2I and 2J show embodiments for reading the information value stored in the first programmable structure 150, and FIGS. 2K and 2L show embodiments for reading the information value stored in the second programmable structure 160.

Accordingly, in FIGS. 2I and 2J, the read voltage Vread is applied to the first control structure 152 and the bridge voltage Vbridge is applied to the second control structure 162, whereas in FIGS. 2K and 2L the read voltage Vread is applied to the second control structure 162 and the bridge voltage Vbridge is applied to the first control structure 152.

In FIGS. 2I and 2J, the first bit line 122 and the first contact area 120 are connected to the current sink and the sense port of the sense amplifier 210', whereas the second bit line 132 and the second contact area 130 are connected to a voltage higher than the ground voltage, for example to the supply voltage VDD.

FIG. 2I shows an embodiment of the semiconductor device with a first programmable structure 150 storing a first information value (erased). As both sections 142, 144 are conductive ("on"), a current flows from the second contact area 130 to the first contact area 120. Accordingly, the voltage at the first bit line 122 is raised or pulled up above the given threshold and the sense amplifier 210' reads the corresponding first information value from the first programmable structure.

FIG. 2J shows a similar embodiment with regard to FIG. 2I, however, the embodiment of the semiconductor device comprises a first programmable structure 150 storing a second information value. The first section 142 is blocked ("off"), and no current flows from the second contact area 130 to the first contact area 120. Accordingly, the voltage of the first bit line 122 remains below the given threshold voltage and the sense amplifier 210' reads the corresponding second information value from the first programmable structure 150.

Further embodiments of the semiconductor device comprise controllers 170 adapted to connect the first bit line 122 and the second bit line 132 in a reverse manner compared to FIGS. 2I and 2J, or in other words to connect the first bit line 122 with, for example, a supply voltage VDD, and to connect the second bit line 132 with the sense amplifier 210' and to use the second bit line 132 to sense or read the information value stored in the first programmable structure 150.

FIGS. 2K and 2L show two embodiments of the semiconductor device for reading out the information value stored in the second programmable structure 160. Accordingly, a bridge voltage Vbridge is applied to the first control structure 152 and the read voltage Vread is applied to the second control structure 162. Similar to the embodiments shown in FIGS. 2I and 2J, the sense amplifier 210' is connected to the contact area associated with the programmable structure to be read, i.e., in FIGS. 2L and 2K with the second contact area 130, and the contact area associated to the programmable structure to be bridged, i.e., in this case the first contact area 120, is connected to a voltage higher than a ground voltage, for example, to the supply voltage VDD.

FIG. 2K shows an embodiment of the semiconductor device with a second programmable structure 160 storing a first information value (erased). Both sections 142, 144 are conductive ("on"). Accordingly, a current flows from the first contact area 120 to the second contact area 130, the voltage at the second bit line 132 is raised or pulled up above the given threshold voltage, and the sense amplifier 210' reads or senses the corresponding first information value from the second programmable structure 160.

FIG. 2L shows a similar embodiment as FIG. 2K, however, the second programmable structure 160 stores a second information value (programmed), and no current flows from the first contact area 120 to the second contact area 130. Accordingly, the voltage of the second bit line 132 remains below the given threshold voltage and the sense amplifier 210' reads or senses the corresponding second information value from the second programmable structure 160.

The same general considerations as explained for FIGS. 2A to 2H also apply to FIGS. 2I to 2L.

Figure 2M:
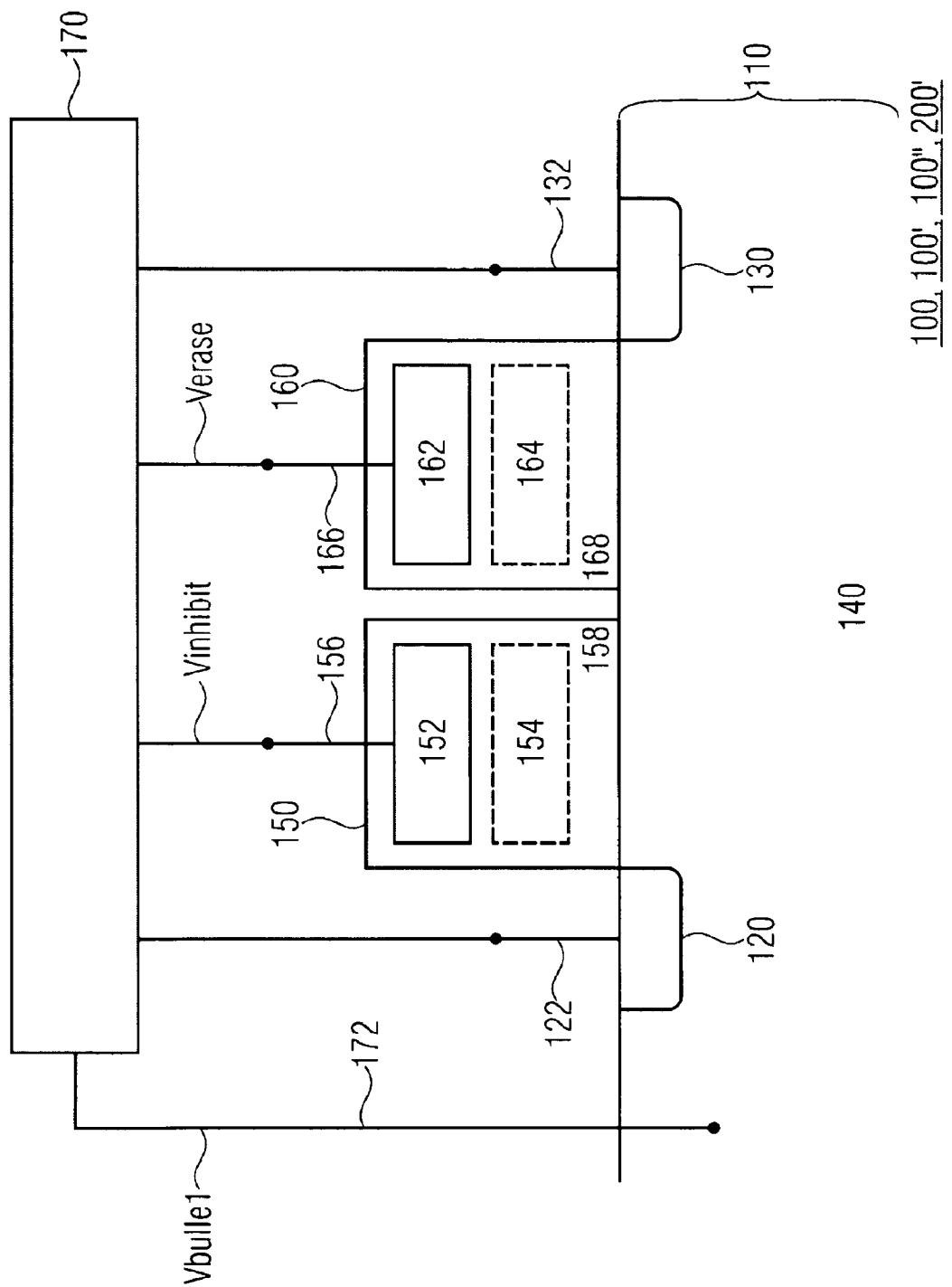
FIG. 2M shows a schematic drawing of an embodiment of a semiconductor device according to FIG. 1D for erasing the information value stored in the first programmable structure.

FIG. 2M shows an embodiment of a semiconductor device 200' comprising a controller 170 for erasing a value stored in a programmable structure 150 or 160. The general structure of the semiconductor device corresponds, for example, to the embodiments 100, 100' and 100", as discussed based on the previous figures.

In FIG. 2M, a scenario is shown, where the controller 170 erases the information value 164 stored in the second programmable structure 160. For erasing the information value 164, the controller 170 is adapted to apply an erase voltage Verase to the second control structure 162 of the second programmable structure 160, to apply an inhibit voltage Vinhibit to the first control structure 152 of the first programmable structure 150, and a first bulk voltage or bulk erase voltage Vbulk1. The first bit line 122 and the second bit line 132 can be disconnected to be in a floating state or also connected to the first bulk voltage Vbulk1 to support the erasure of the information value 164 stored in the second programmable structure 160. The first bulk voltage Vbulk1 is at ground level or positive, depending on the well structure of the semiconductor device, as will be explained later, and the erase voltage Verase is negative. The voltage difference between the first bulk voltage Vbulk1 and the erase voltage Verase is defined such that it is large enough to store negative charge in the second programmable structure 160, or in other words in the programmable structure to be programmed. According to one embodiment, the voltage difference is large enough to cause electrons to tunnel through the insulating structure 168 of the programmable structure 160 to be programmed and to be trapped, for example, by a floating gate 167 or a charge-trapping nitride 169. At the same time, the voltage difference between the first bulk voltage Vbulk1 and the erase voltage Verase is small enough to avoid damage of the insulating structure 168, for example, caused by a breakthrough. The inhibit voltage is defined such that the inhibit voltage is below or smaller than the first bulk voltage Vbulk1, but at the same time higher or above the erase voltage Verase, to avoid an unintended erasure of the other programmable structure, i.e., here of the first programmable structure 150. In other words, the difference between the first bulk voltage Vbulk1 and the inhibit voltage Vinhibit is such that the information value stored in the other programmable structure 150 is maintained. The insulating structure between the control structure 162 of the programmable structure to be erased and the control structure 152 of the other programmable structure 150 is defined such that the difference between the inhibit voltage Vinhibit and the erase voltage Verase does not cause any tunneling of electrons or damage to the insulating structure. The insulating structure between the two control gates 152 and 162 and/or between the first charge-trapping means 157, 159 and the second charge-trapping means 167 and 169 is also referred to as sidewall insulation.

The voltages to be applied during erasing depend on the well structure of the semiconductor device, as will be explained based on FIGS. 2O and 2P.

FIG. 2O shows an embodiment of the semiconductor device comprising a two-well structure comprising a first well 140 forming the channel or bulk area 140, and is also referred to as active area 140, and a second well 112 formed by the inactive part of the substrate 110. As explained before, one typical embodiment comprises n+-doped first and second contact areas 120, 130 arranged in the p-doped bulk area 140 and the bulk area 140 again arranged in the undoped or low n-doped second well 112. In this case, the pn-junction between the bulk area 140 and the inactive area 112 will open if a positive first bulk voltage Vbulk1 is applied to the bulk area 140 for erasing an information value stored in a programmable structure 150, 160. Therefore, a first bulk voltage Vbulk1 is set to ground voltage GND and a erase voltage Verase, for example, to −17 V to apply a voltage difference between the bulk area and the second control structure 162, which is large enough to cause electrons to tunnel from the charge-trapping means 167, 169 through the tunnel oxide 168 to the bulk area 140.

Figure 2N:
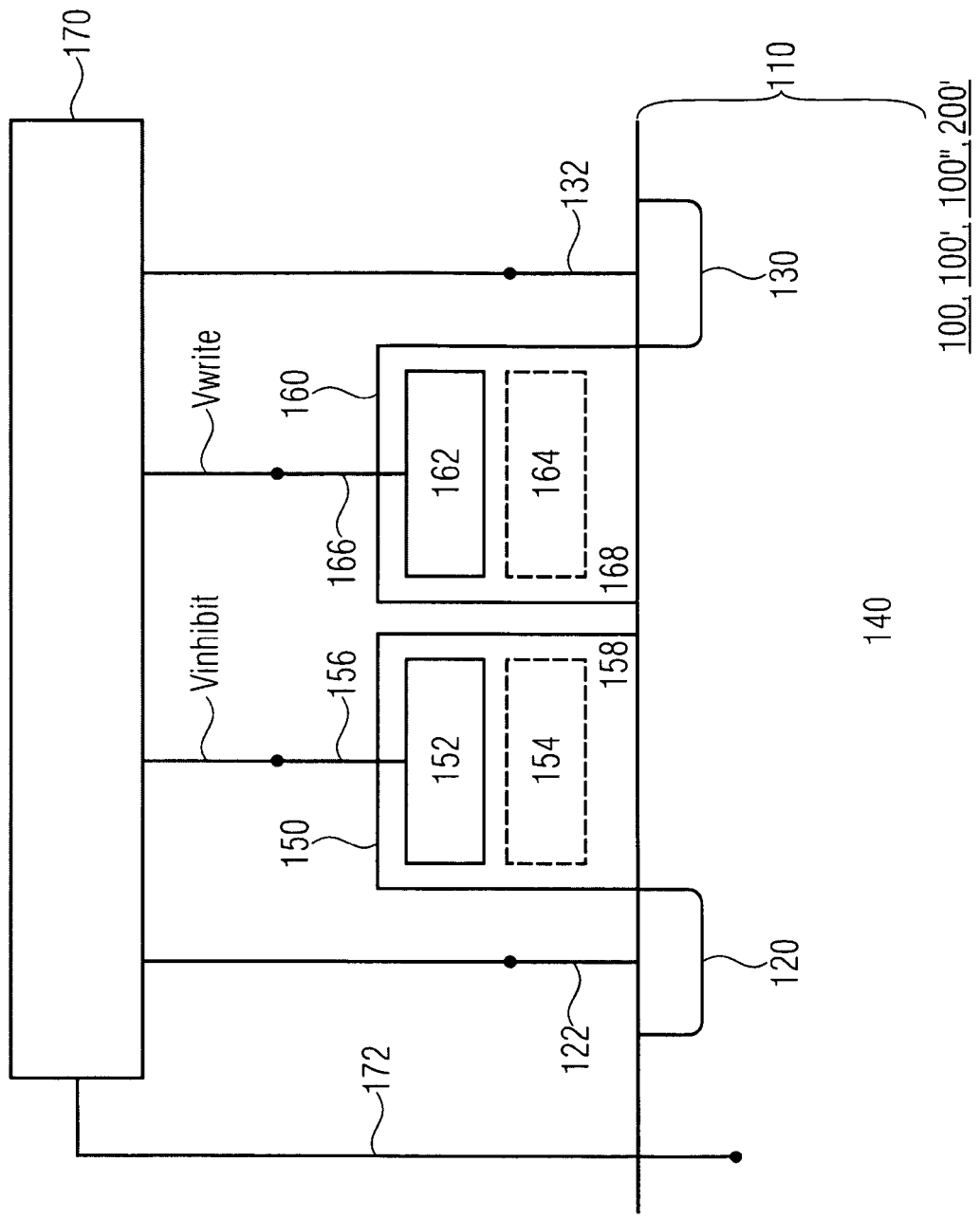
FIG. 2N shows a schematic diagram of an embodiment of a semiconductor device according to FIG. 1D for programming the first programmable structure.
Figure 20:
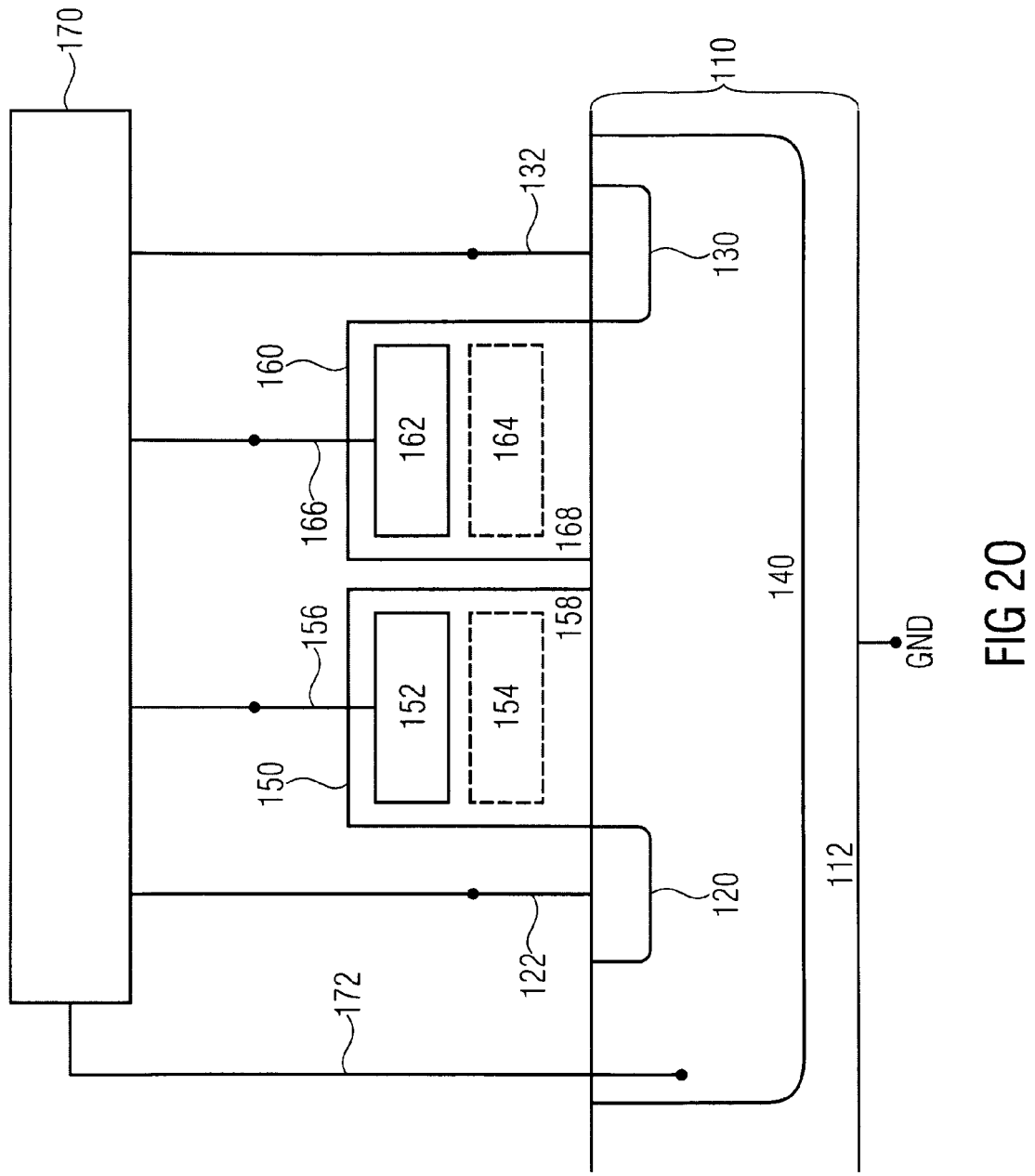
Figure 2P:
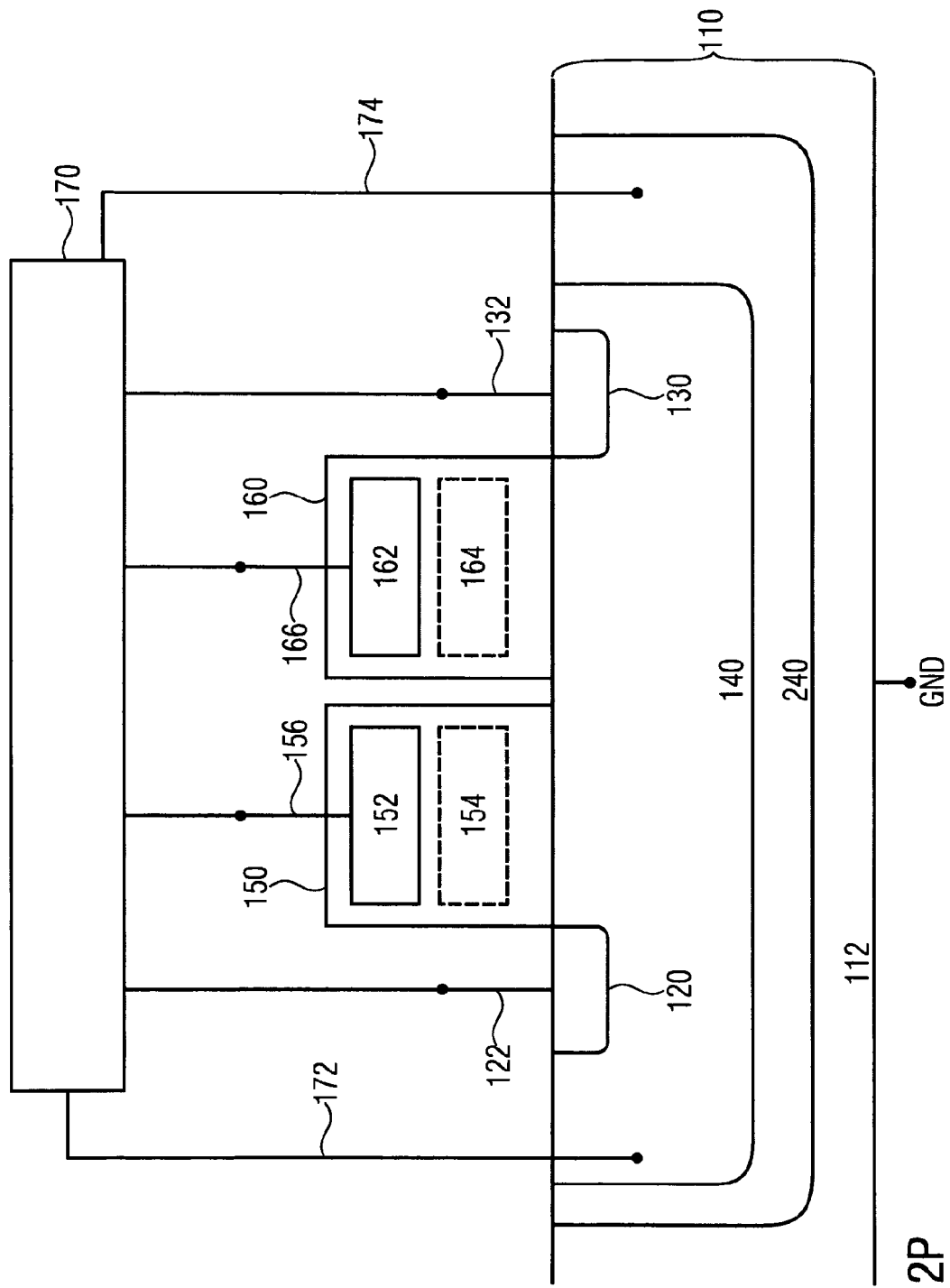
FIG. 2P shows a schematic diagram of an embodiment of a semiconductor device according to FIG. 1A or 1D comprising a triple-well structure.

FIG. 2P shows an embodiment of the semiconductor device comprising a triple-well structure comprising a first well 140, a second or buried well 240 and the inactive substrate or third well 112. The second or buried well 240 is electrically connected to a connecting line 174, and, for example, via the connecting line 174 to the controller 170. The second well is, for example, a n-well. For erasing an information value stored in the second control structure 162, the controller 170 is adapted to apply via connecting line 174 a voltage to the second well, which is higher than the first bulk voltage Vbulk1 applied to the bulk area 140. Thus, the pn-junction between the bulk area 140 and buried well 240 is maintained closed. In this case, a positive first bulk voltage Vbulk1 can be applied to the bulk area 140, for example, +4V and to achieve the same voltage difference of 17V, the erase voltage Verase only has to be set to −13V. The erasing of the information value stored in the first programmable structure 150 is performed accordingly, i.e., by applying the inhibit voltage Vinhibit to the second control structure 162 and the erase voltage Verase to the first control structure 152.

FIG. 2N shows an embodiment of a semiconductor device for programming or writing the second programmable structure 160. A controller 170 is adapted to apply a write voltage Vwrite to the second control structure 162, an inhibit voltage Vinhibit to the first control structure, and a data voltage Vdata to the first bit line 122, first contact area 120 and the second bit line 132, second contact area 130. The write voltage Vwrite is positive and the inhibit voltage Vinhibit is positive but smaller than the write voltage Vwrite. The write voltage Vwrite may be set, for example, to +13V, whereas the inhibit voltage Vinhibit may, for example, be set to +4V. In case the second programmable structure 160 is to be programmed, i.e., charged negatively by tunneling electrons from the bulk area 140 through the insulating structure 168 to the charge-trapping means 167, 169, the data voltage Vdata is set to a negative second bulk voltage Vbulk2, for example, −4V. In this case, the difference between the write voltage Vwrite and the voltage applied to the channel area 140 is −17V, and thus large enough to cause electrons to tunnel through the insulating structure 168 to the charge-trapping means of the second programmable structure 160. In case the second programmable structure 160 shall remain in an erased state, the inhibit voltage Vinhibit is applied as data voltage Vdata. Accordingly, the difference between the write voltage Vwrite and the voltage at the channel area 140 is too small to cause the electrons to tunnel and, thus, the second programmable structure remains in an erased state.

In other words, the inhibit voltage Vinhibit is not as negative as the bulk voltage Vbulk2 and not as positive as the write voltage Vwrite. Thus, the programmable structure is not stressed, or in other words not programmed. In case the second bulk voltage Vbulk2 is applied to the bit lines 122, 132, the second control structure 162 sees a high voltage drop over the tunnel oxide of Vtunnel=Vwrite−Vdata, and thus is programmed. The voltage difference at the first programmable structure 150 is Voxide=Vinhibit−Vdata, +4V−(−4V)=8V. Thus, the first programmable structure is not programmed or erased. The voltage drop over the insulating sidewall Vsidewall is defined by the inhibit voltage applied to the first control structure and the write voltage applied to the second control structure, i.e., Vsidewall=Vinhibit−Vwrite. Staying with the example values for different voltages, the sidewall voltage Vsidewall=Vinhibit−Vwrite=+4V−13V=−9V. Thus, no tunneling occurs between the two control structures.

Compared to conventional EEPROM architectures, two programmable transistors connected in series share the source and drain contacts. Thus, the number of drain/source contacts per programmable transistor or programmable structure can be reduced by half. Furthermore, the problem of leakage currents caused by overerased cells, i.e., cells that are not in a neutral state with regard to their charge but, for example, positively charged, is reduced, because a leakage current only occurs when both programmable structures are overerased, which is statistically very unlikely.

Figure 2Q:
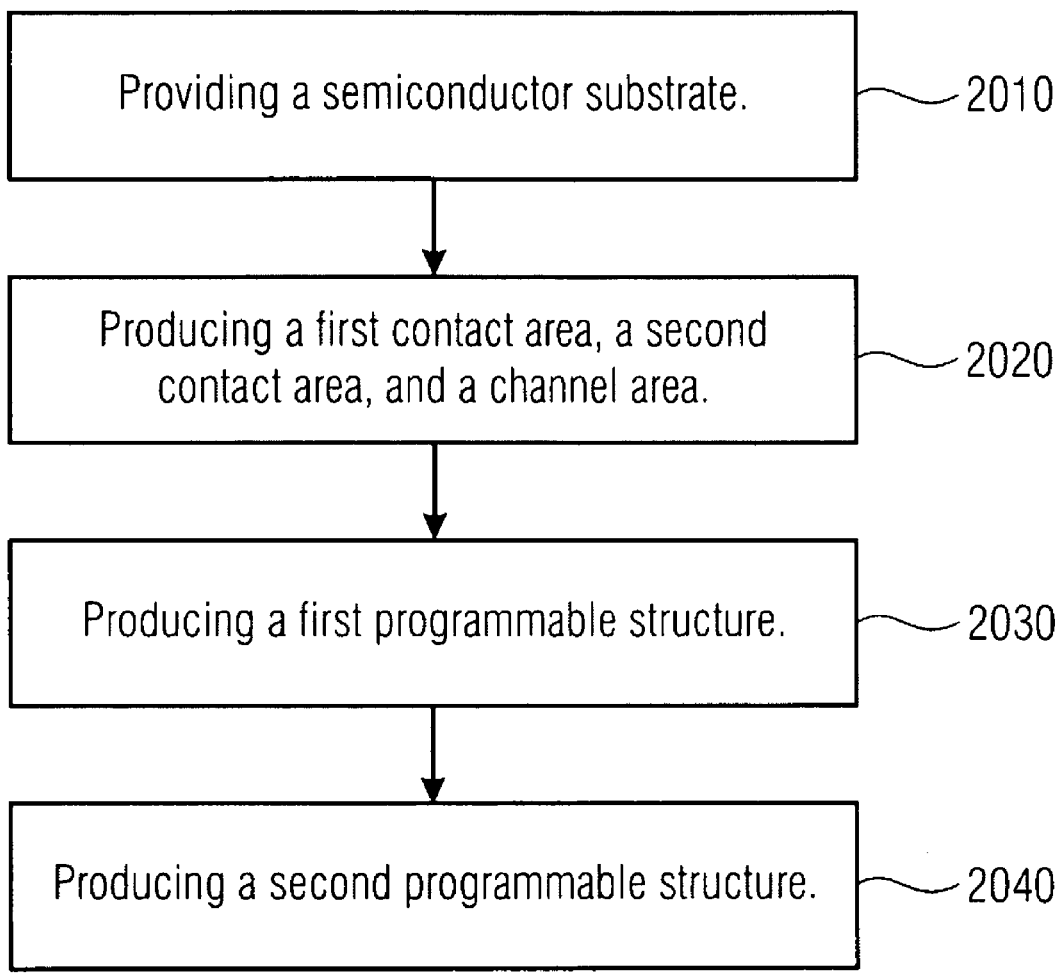
FIG. 2Q shows a flow diagram of an embodiment of a method for producing a semiconductor device.

FIG. 2Q shows a flow diagram of a method of producing a semiconductor device 100, 100', 100".

The method comprises providing in step 2010 a semiconductor substrate 110. The method further comprises producing in step 2020 a first contact area 120, a second contact area 130, and a channel area 140 arranged in the semiconductor substrate 110 between the first contact area 120 and the second contact area 130. The method also comprises producing in step 2030 a first programmable structure 150, comprising a first control structure 152, the first programmable structure being arranged such that a conductivity of a first section 142 of the channel area 140 depends on a voltage applicable to the first control structure of the first programmable structure and on a charge value stored in the first programmable structure; and producing in step 2040 a second programmable structure 160, comprising a second control structure 162, the second programmable structure being arranged such that a conductivity of a second section of the channel area depends on a voltage applicable to the second control structure of the second programmable structure and on a charge value stored in the second programmable structure. The first section 142 and the second section 144 are electrically connected in series between the first contact area 120 and the second contact area 130.

The above steps may be performed in a variety of orders, and in particular, the producing of the first programmable structure and the producing of the second programmable structure can be performed at the same time.

In the following, intermediate and final structures of a programmable memory device comprising floating gate programmable structures will be described based on FIGS. 3A to 3F.

Figure 3A:
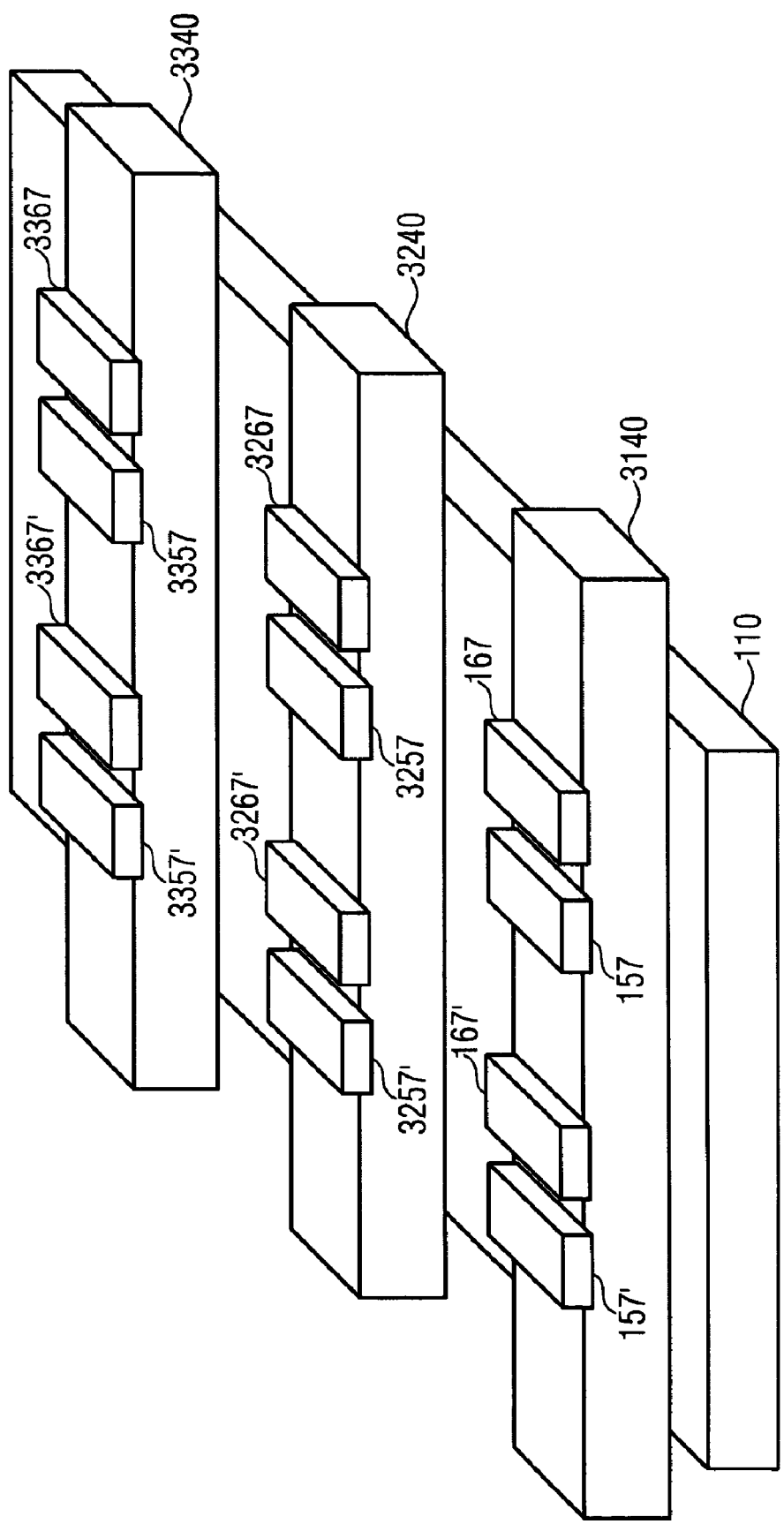

FIG. 3A shows a substrate 110, active areas or bulk areas 3140, 3240 and 3340 arranged parallel to each other. The first bulk area 3140 comprises a first pair of floating gates 157, 167 and a second pair of floating gates 157', 167'. Above the second bulk area 3240, a first pair of floating gates 3257 and 3267 and a second pair of floating gates 3257' and 3267' are arranged. On the third bulk area 3340, a first pair of floating gates 3357 and 3367 and a second pair of floating gates 3357' and 3367' are arranged. The insulating structures for electrically insulating the floating gates from the bulk areas and the first and second contact areas as described based on the previous figures are not shown to not overburden the figures.

Figure 3B:
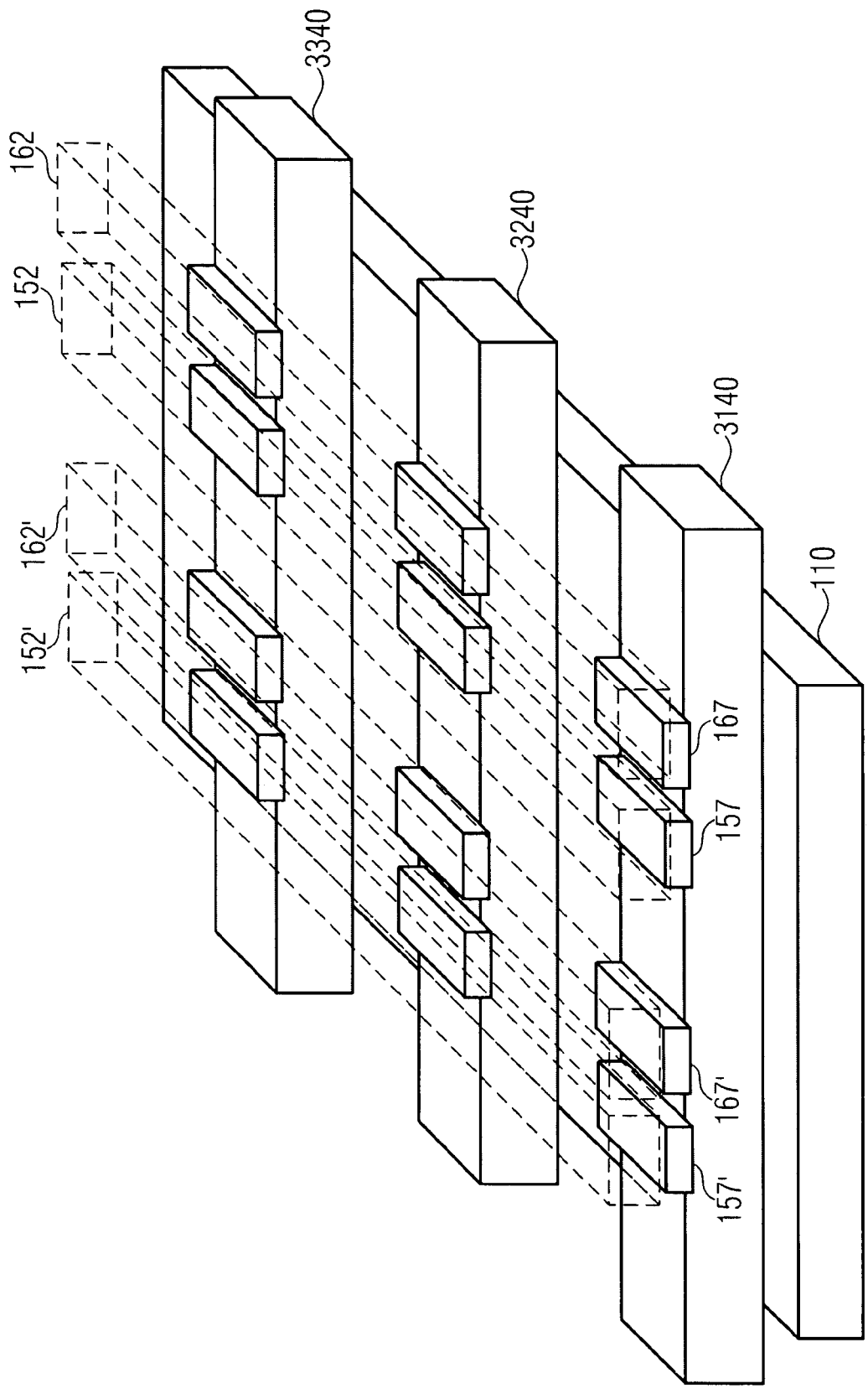

FIG. 3B shows the intermediate structure of FIG. 3A and additionally the control structures or word lines, wherein the first control structure 152 is arranged on top of the first floating gates 157, 3257 and 3357, the second control structure on top of the second floating gates 167, 3267 and 3367, a further first control structure 152' arranged on top of the first floating gate 157', 3257' and 3357', and a further second control structure or word line 162' arranged on top of the second floating gates 167', 3267' and 3367'. The control structures 152, 162, 152' and 162' are shown in hashed lines and are electrically insulated from the floating gates as shown in the previous figures. The control structures are also referred to as control gates or wordlines.

In FIG. 3C, the intermediate structure of FIG. 3B is shown, and additionally drain/source contacts to connect the contact areas. A first contact 3142 is arranged between the first floating gate 157 and the second floating gate 167', a second contact 3144 is arranged such on top of the bulk area 3140 that the floating gates 157 and 167 are arranged between the contacts 3142 and 3144. A third contact 3146 is arranged on top of the first bulk area 3140 such that the floating gates 157' and 167' are arranged between the third contact 3146 and the first contact 3142. Further contacts are arranged in the same manner on top of the second active area 3140 and third bulk area 3340.

FIG. 3D shows the structure of FIG. 3C and additionally a first metallization layer (see dot-hashed lines), wherein a first metal structure 3152 is arranged on top of the first contact 3142, a second metal structure 3154 is arranged on top of the second contact 3144, and a third metal structure 3156 is arranged on top of the third contact 3146. The metal structures are arranged in parallel, wherein consecutive metal structures extend in opposite directions with regard to the position of the contacts. Similar metal structures are arranged on top of the contacts of the other bulk areas 3240 and 3340.

Figure 3E:
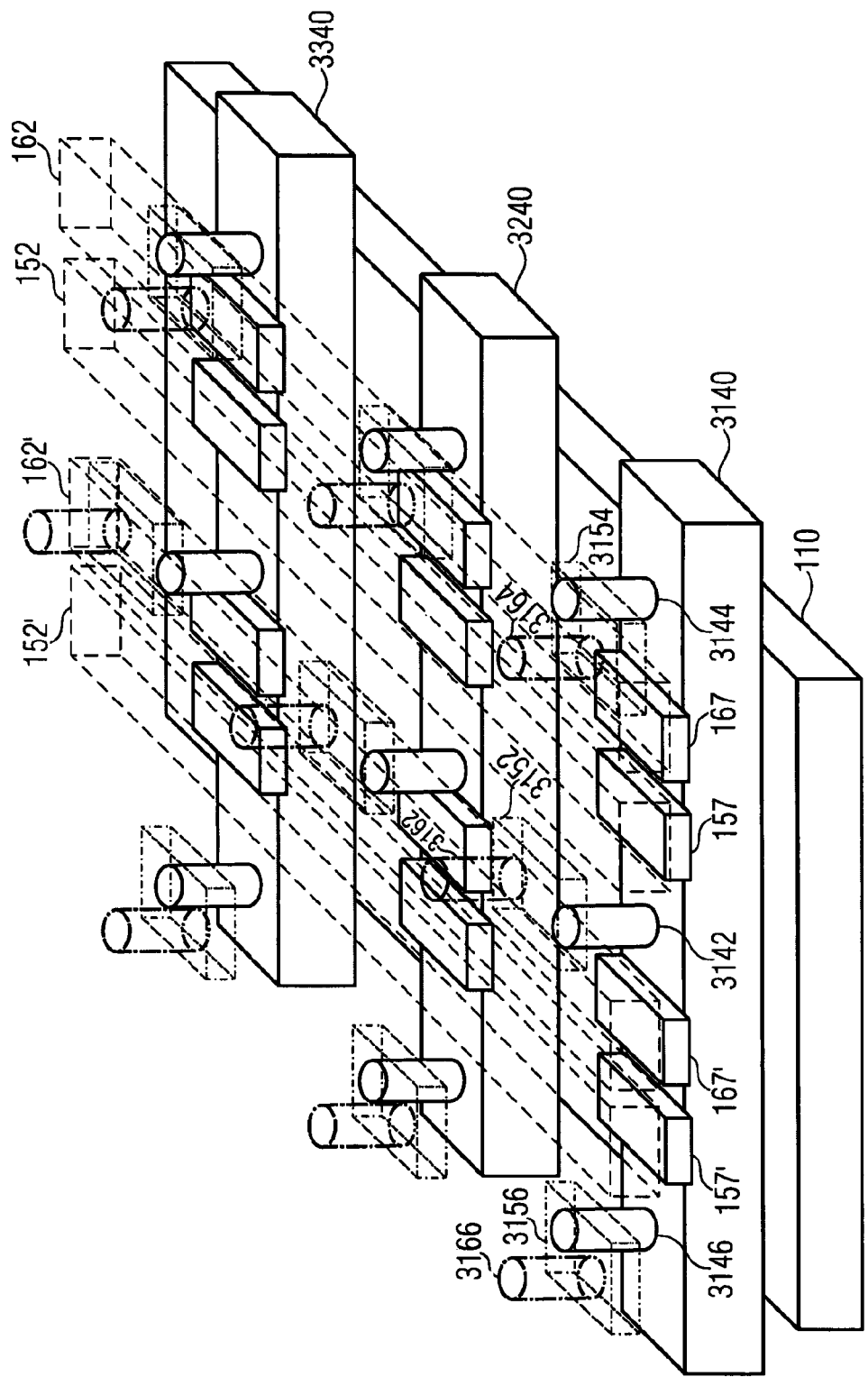

FIG. 3E shows the intermediate structure of FIG. 3D and additionally vias arranged on top of the metal structures. A first via 3162 is arranged on top of the first metal structure 3152 at the opposite side of the metal structure with regard to the position of the first contact 3142. In a corresponding manner, a second via 3164 is arranged on top of the second metal structure 3154 and a third via 3166 on top of the third metal structure 3156. Further vias are arranged in the same manner on top of the metals structures arranged on top of the other bulk areas 3240 and 3340.

Figure 3F:
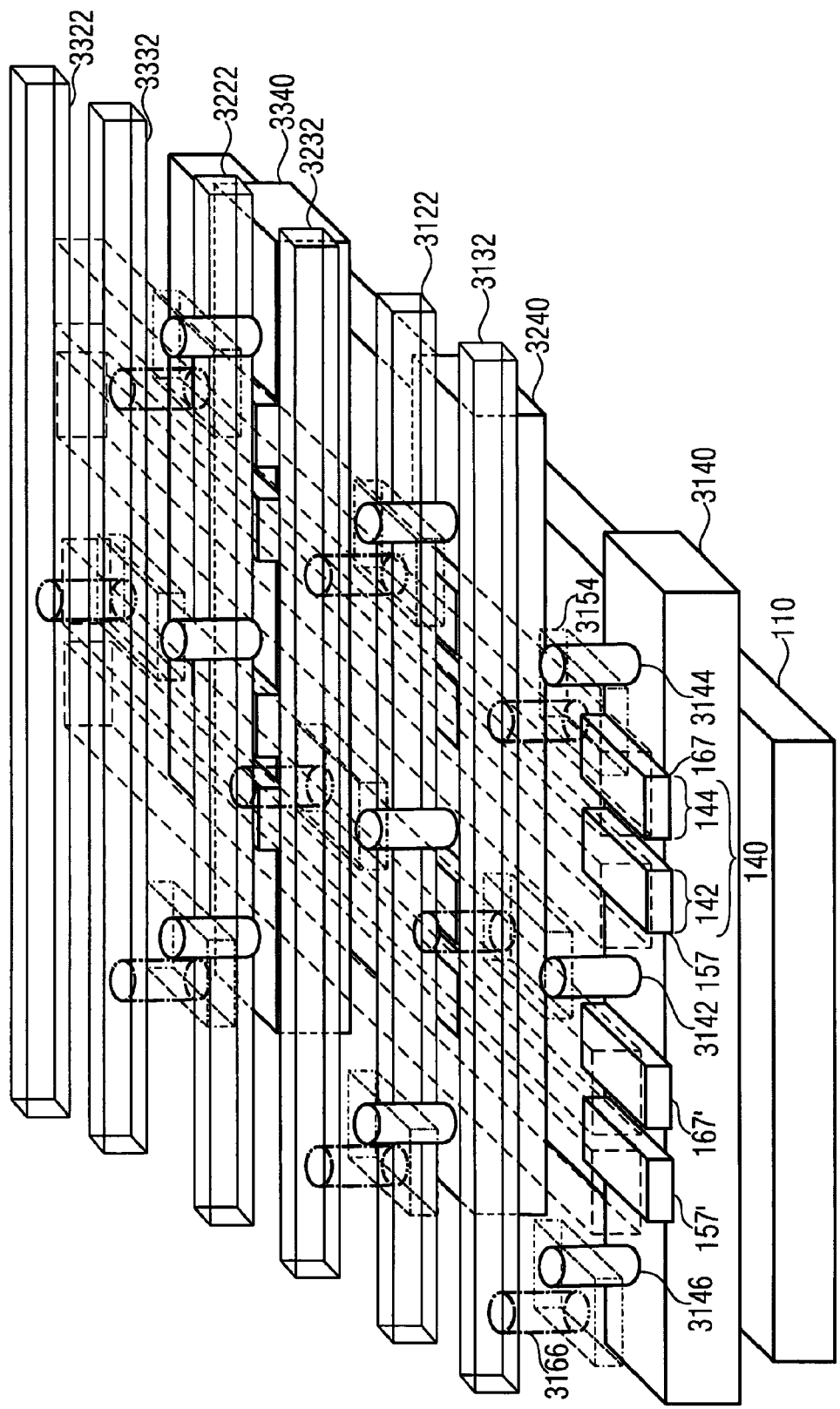

FIG. 3F shows the final structure comprising the intermediate structure of FIG. 3E and additionally bit lines connected to the vias. The bit lines are arranged perpendicular to the word lines. A first bit line 3122 is connected to the first via 3162, and a second bit line 3132 is connected to the second and third vias 3164 and 3166. A third bit line 3222 and a fourth bit line 3232 are connected to the vias associated with the structures arranged on the second bulk area 3240, and a fifth bit line 3322 and a sixth bit line 3332 are connected to the vias associated with the structure arranged on top of the third bulk area 3340. For better comparability with the FIGS. 1A to 2P, the channel area 140 and the first section 142 and the second section 144 have been added to FIG. 3F for one floating-gate programmable structure. The contact 3142, the first metal structure 3152, the first via 3162 and the first bit line 3122 form a first bit line comparable to the first bit line 122 shown in the previous figures. Accordingly, the second contact 3144, the second metal structure 3154, the second via 3164 and the second bit line 3132 form a second bit line comparable to the second bit line 132 as shown in the previous figures.

In the following, read, erase and write operations performed on the programmable memory device will be described based on FIGS. 4A to 4F. For better readability, FIGS. 4A to 4F show only a first bulk area 3140 and the programmable transistor structures and connection structures including the first and second bit line 3122, 3132, of the embodiment of the programmable memory device according to FIG. 3F.

FIGS. 4A to 4D show read operations and the corresponding current flows for a first programmable structure 150 and the second programmable structure 160 of an embodiment of the semiconductor device 100, 100', 100", 200. In other words, FIGS. 4A to 4F show an embodiment of a programmable memory device comprising a first semiconductor device and a second semiconductor device, wherein the first and the second semiconductor devices have a common bulk area 3140. The floating gates 157, 167, the control structures 152, 162 and the associated sections 142, 144 represent an embodiment of the semiconductor device according to FIGS. 1A to 2P, and wherein the floating gate 157', 167', the control structures 152', 162' and the sections 142', 144' form a second semiconductor device according to FIGS. 1A to 2P.

Figure 4A:
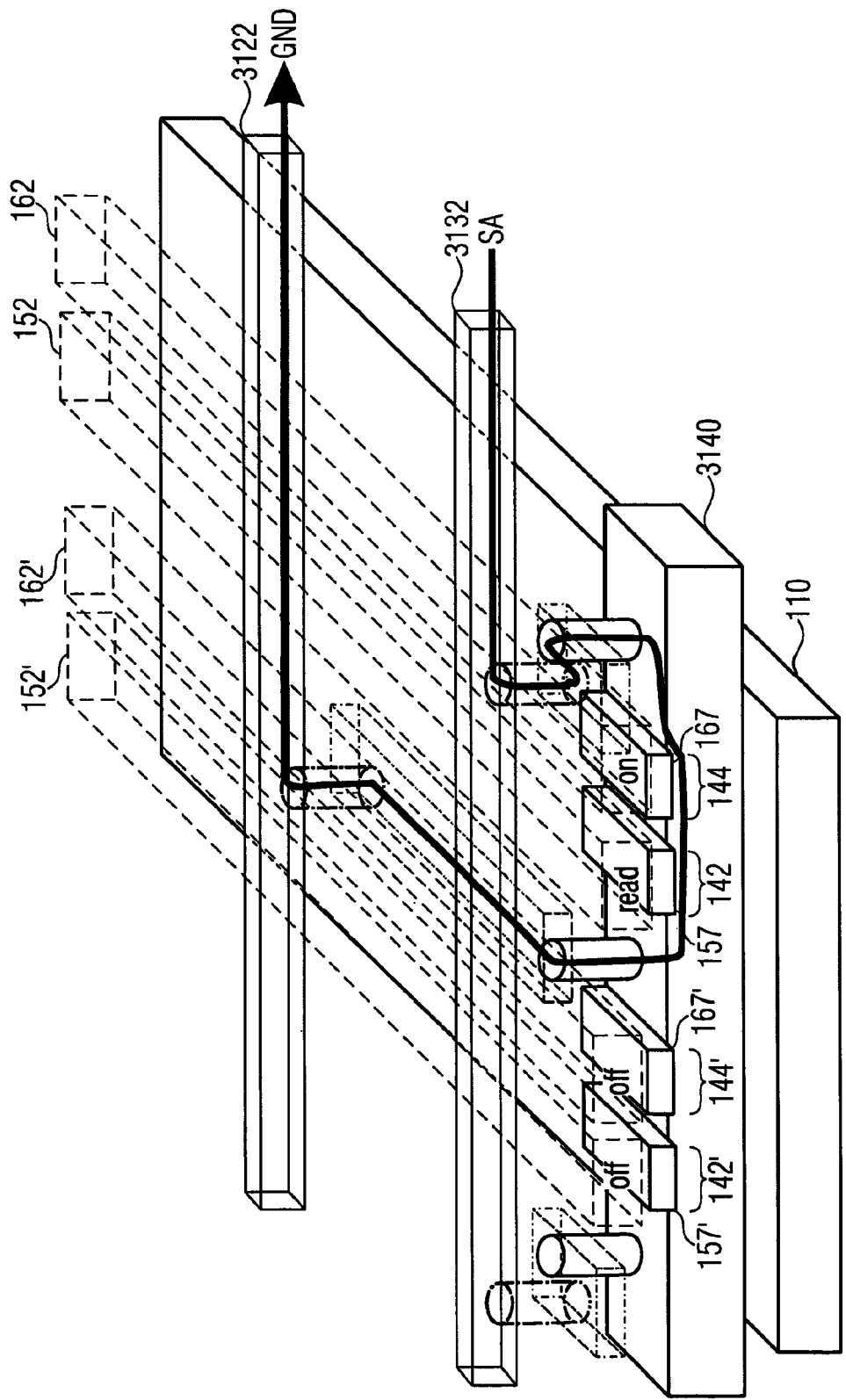
FIGS. 4A-4D show perspective drawings of a programmable memory device for reading information values stored in a first or second programmable structure.

FIG. 4A shows a read operation of the first programmable structure 150 of the first semiconductor device 150. The first programmable structure 150 stores a first information value (erased). The first contact area (not shown) is connected to a ground voltage GND, whereas the second contact structure (not shown) is connected to a sense amplifier comprising a current source. A read voltage Vread supplied to the first control structure 152 ("read" in FIG. 4A) and a bridge voltage Vbridge is applied to a second control structure 162 ("on" in FIG. 4A). As explained based on FIG. 2A, both sections 142, 144 are conductive, and a current flows from the second bit line 3132 through the channel area and the first bit line 3122. Accordingly, the voltage at the second bit line 3132 is pulled down a given threshold and the sense amplifier reads the first information value from the first programmable structure of the first semiconductor device. During the read operation of the first semiconductor device, the control structures 152', 162' of the second semiconductor device are not activated ("off") to prevent unintended influences from the programmable structures of the second semiconductor device.

Figure 4B:
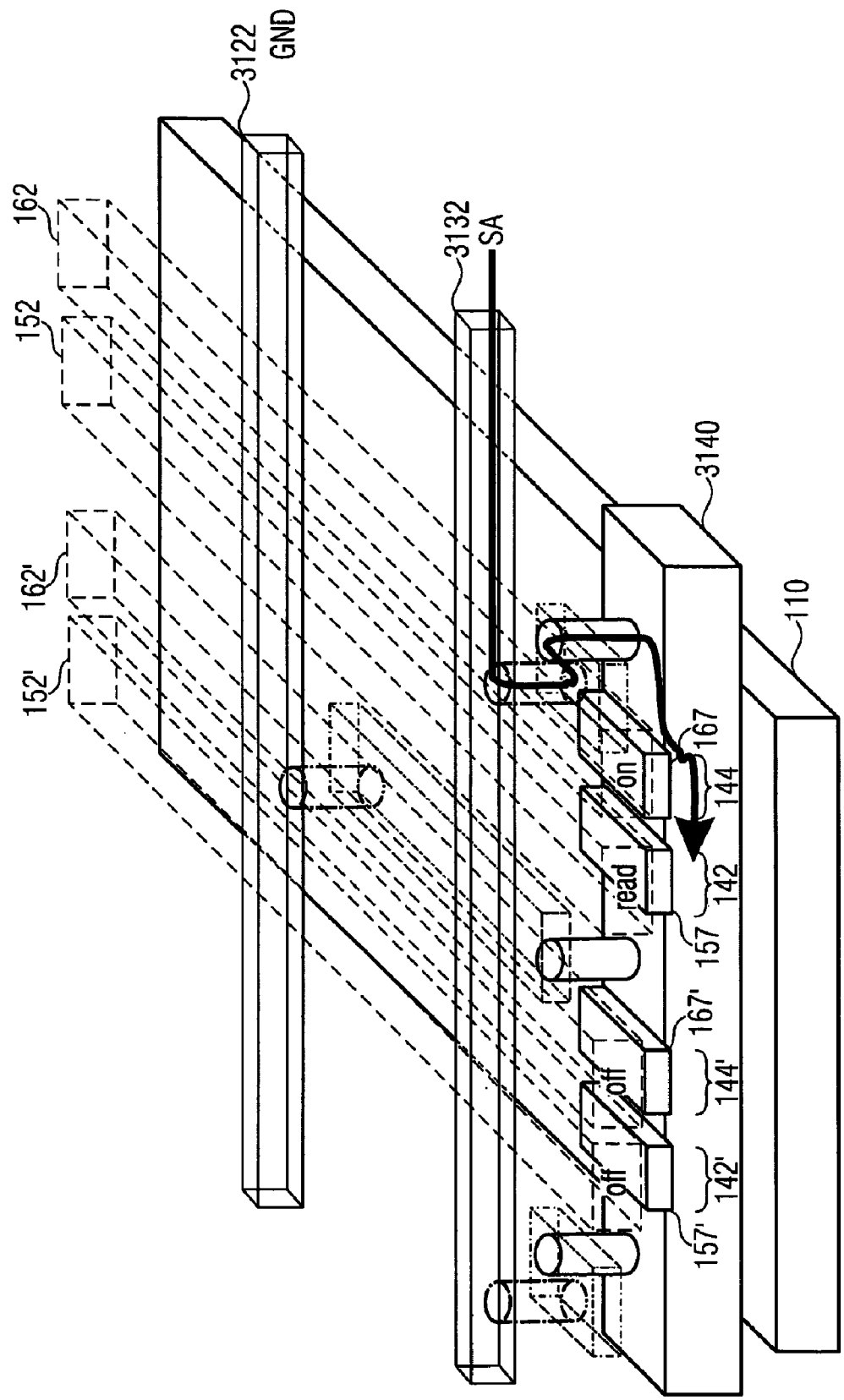

FIG. 4B shows a similar scenario like in FIG. 4A, however, in FIG. 4B the first programmable structure 150 stores a second information value (programmed). The programmed programmable structure, also referred to as a programmed cell, does not allow the current to flow to ground GND. The voltage at the second bit line 3132 maintains a voltage higher than the given threshold value, and the corresponding second information value is read out from the sense amplifier.

The bridged or overforced programmable structure 160 does not see the full bridge voltage stress but only: Vbridge– "voltage caused by a current source of the sense amplifier"=Vbridge–logic level=Vbridge–1.5V, 1.5V, for example, being the supply voltage VDD generated by the current source of the sense amplifier. The bridge voltage Vbridge can, for example, be set to 5V. The scenario shown in FIG. 4B corresponds to the scenario shown in FIG. 2B.

Figure 4C:
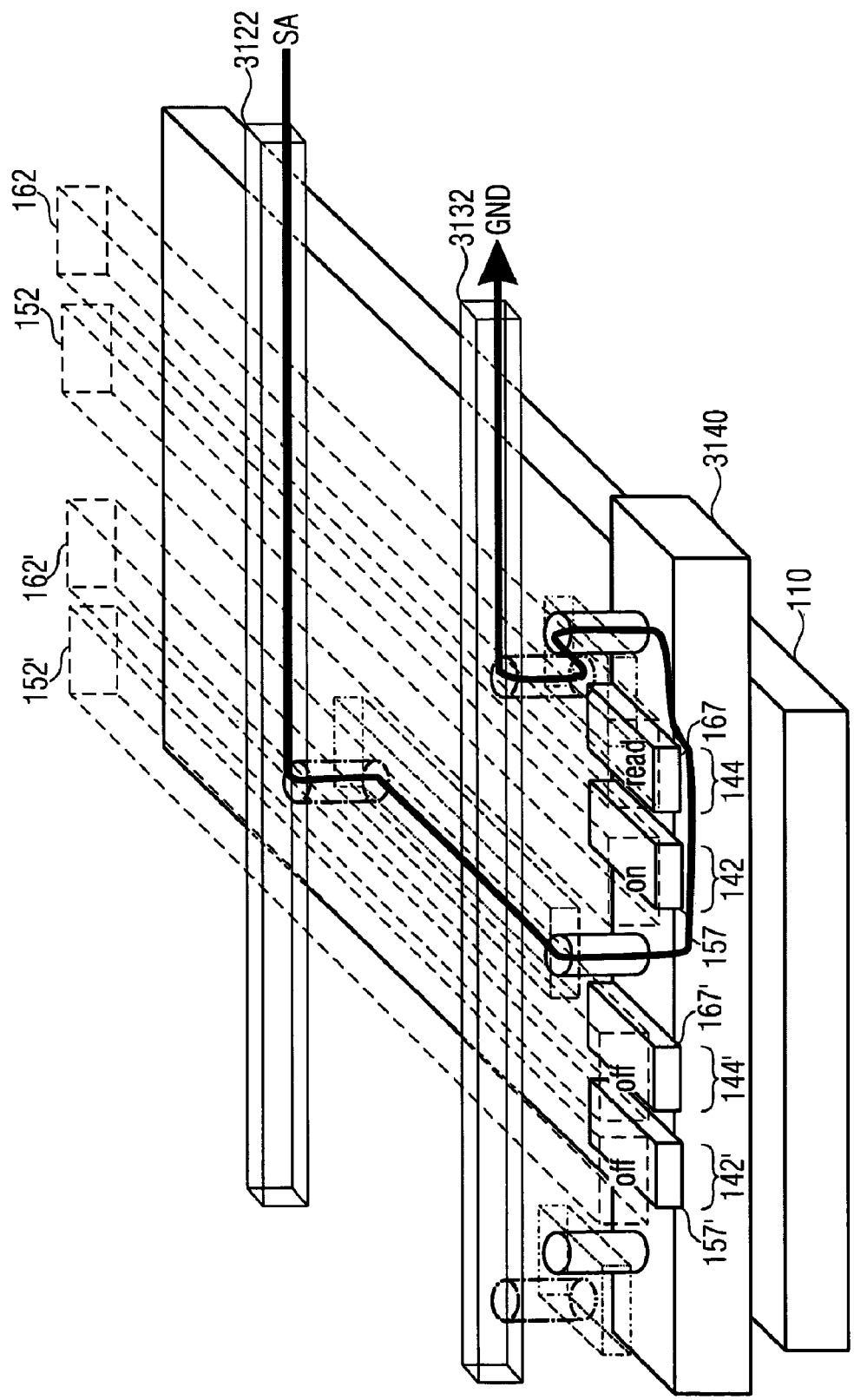
Figure 4D:
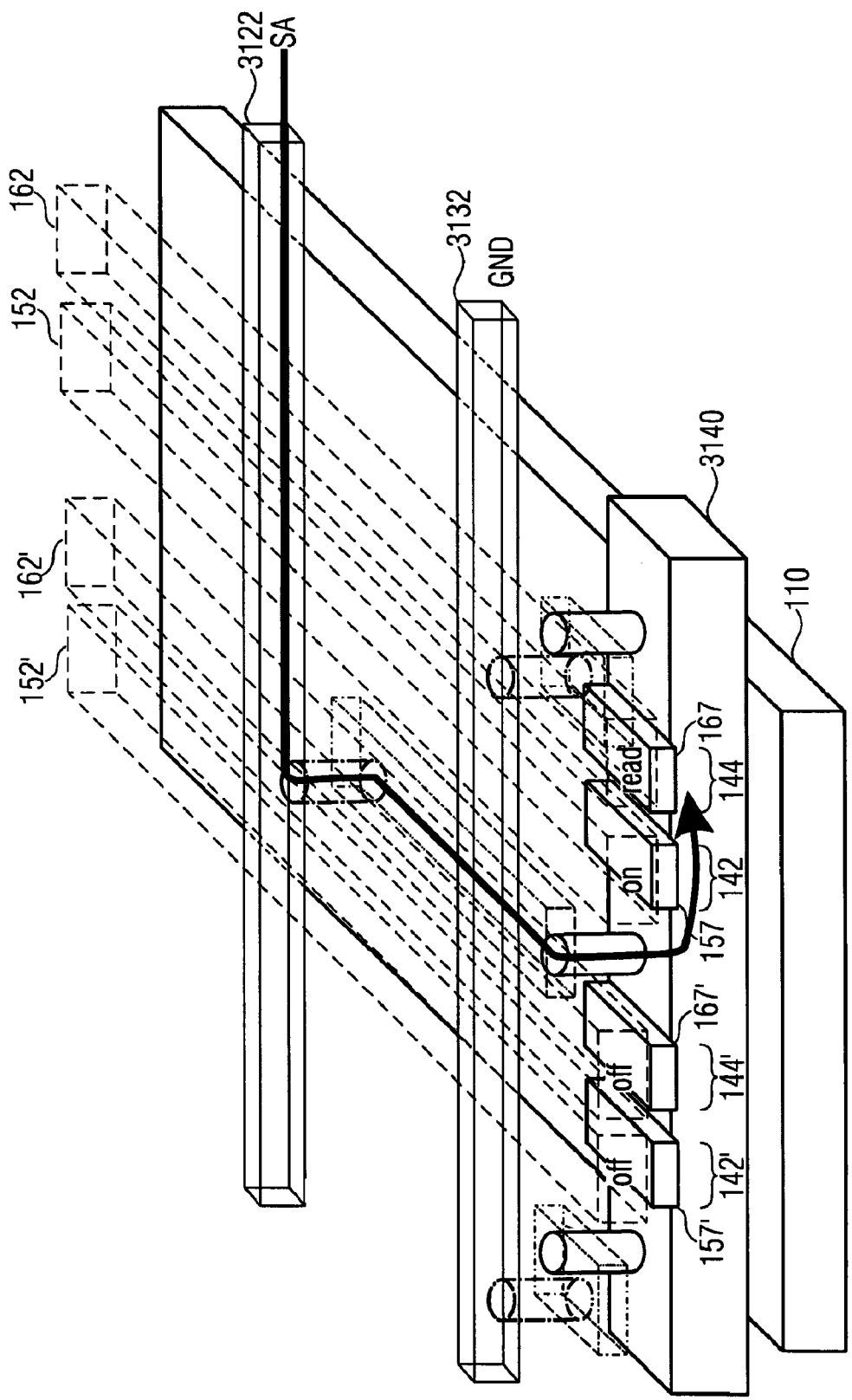

FIG. 4C shows a read operation of the second programmable structure 160 of the first semiconductor device. The bridge voltage Vbridge is applied to a second control structure 162 ("read" in FIG. 4C) and the bridge voltage is applied to a first control structure 152 ("on" in FIG. 4C). The first bit line 3122 is connected to a sense amplifier comprising a current source, the second bit line 3132 is connected to ground voltage GND. In FIG. 4C, the second programmable structure 160 stores a first information value. Accordingly, the erased programmable structure or erased cell allows a current (see arrow) flow to ground GND, and the sense amplifier reads the corresponding first information value or erased state from the second programmable structure of the first semiconductor device. The scenario according to FIG. 4C corresponds to the scenario described based on FIG. 2E FIG. 4D shows a similar scenario to FIG. 4C, however, in FIG. 4D the second programmable structure 160 stores the second information value. A programmed programmable structure or programmed cell does not allow a current to flow to ground GND. Accordingly, the voltage at the first bit line 3122 maintains a voltage above the threshold voltage, and the sense amplifier reads the corresponding second information value or programmed state for the second programmable structure of the first semiconductor device. This scenario corresponds to the one described based on FIG. 2F.

Similar to FIG. 4B, the bridged programmable structure or overforced cell does not see the full bridge voltage stress but a bridge voltage stress reduced by the sense amplifier voltage SA, in other words, Vbridge−SA=Vbridge−logic level=Vbridge−1.5V. In other words, the controller (not shown in FIG. 4) is adapted to exchange the connections to the bit lines and the control structures to read one of the two programmable structures of the semiconductor device (see FIGS. 4A and 4B for reading the first programmable structure 150, and FIGS. 4C and 4D for reading the second programmable structure 160).

Figure 4E:
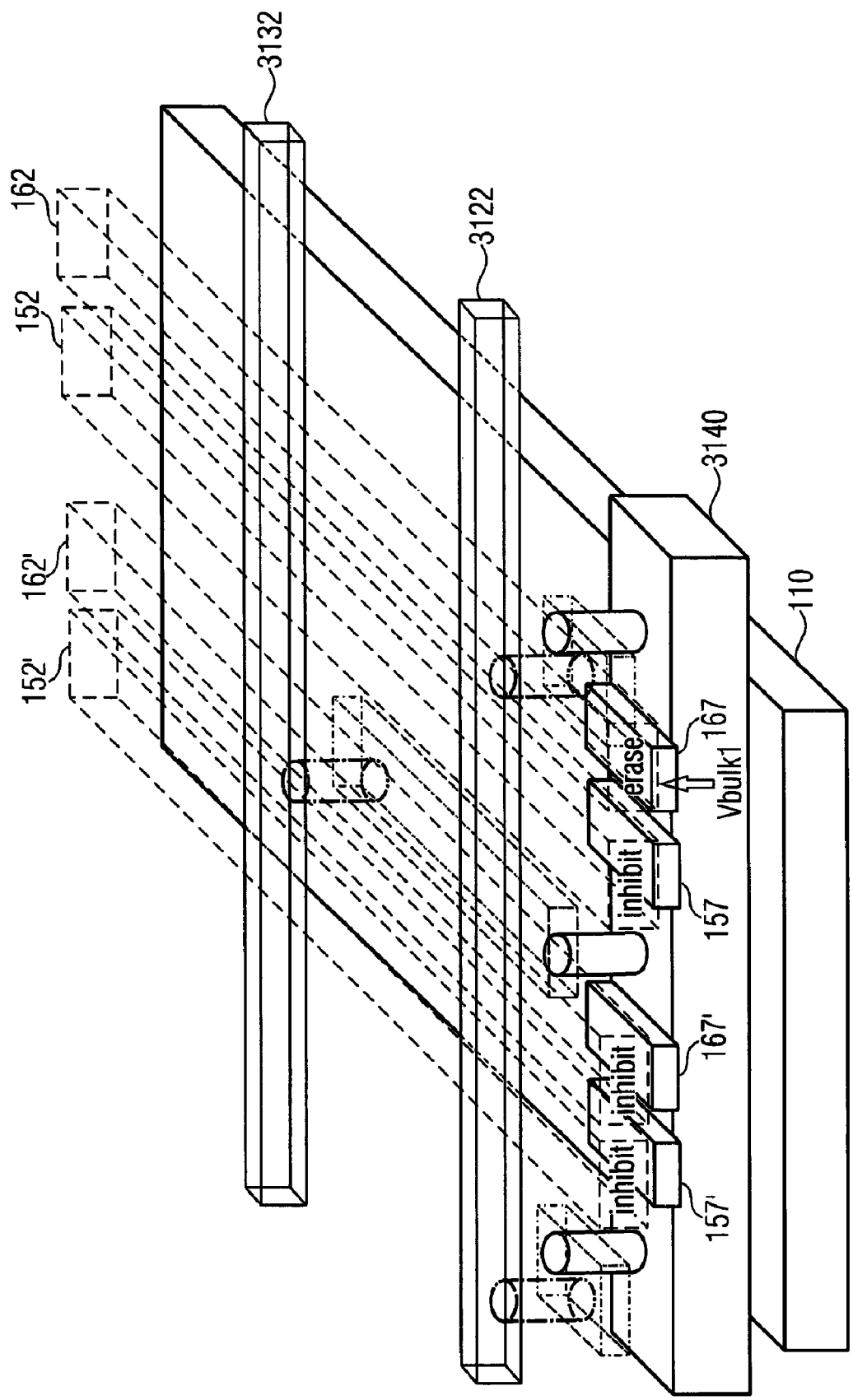
FIG. 4E shows a perspective view of an embodiment of a programmable memory device for erasing the second programmable structure.

FIG. 4E shows the erase operation for the second programmable structure 160 of the first semiconductor device. This scenario corresponds to the scenario described based on FIG. 2M. The erase voltage Verase is applied to the second control structure 162 of the first semiconductor device. The inhibit voltage Vinhibit is applied to the first control structure 152 of the first semiconductor device and to both control structures 152', 162' of the second semiconductor device. The inhibit voltage Vinhibit is not as positive as the first bulk voltage Vbulk1 and not as negative as the erase voltage Verase. Thus, no stress is applied to the first programmable structure 150 and the programmable structures of the second semiconductor device, i.e., these programmable structures are not erased. The voltage drop of Voxide over the insulating structure of the insulating structure 158 and over the insulating structures of the programmable structures of the second semiconductor device is, thus, Voxide=Vinhibit−Vbulk1. The voltage drop between the first control structure 152 of the first programmable structure and the second control structure 162 of the second programmable structure (Vsidewall) is defined as: Vsidewall=Vinhibit−Verase. The control structure or word line 162 to be erased sees a high voltage drop over the tunnel oxide, i.e., the insulating structure 168. The voltage over the tunnel oxide is defined as: Vtunnel=Verase−Vbulk1. Thus, the second programmable structure 160 is erased. The arrow in FIG. 4E shows a direction of the effective tunneling. The bulk potential is forward biased. A triple-well concept prevents shorts to substrate ground GND, as explained based on FIGS. 2O and 2P. The bit lines 3122, 3132 are connected to the first bulk voltage Vbulk1 or are floating.

Figure 4F:
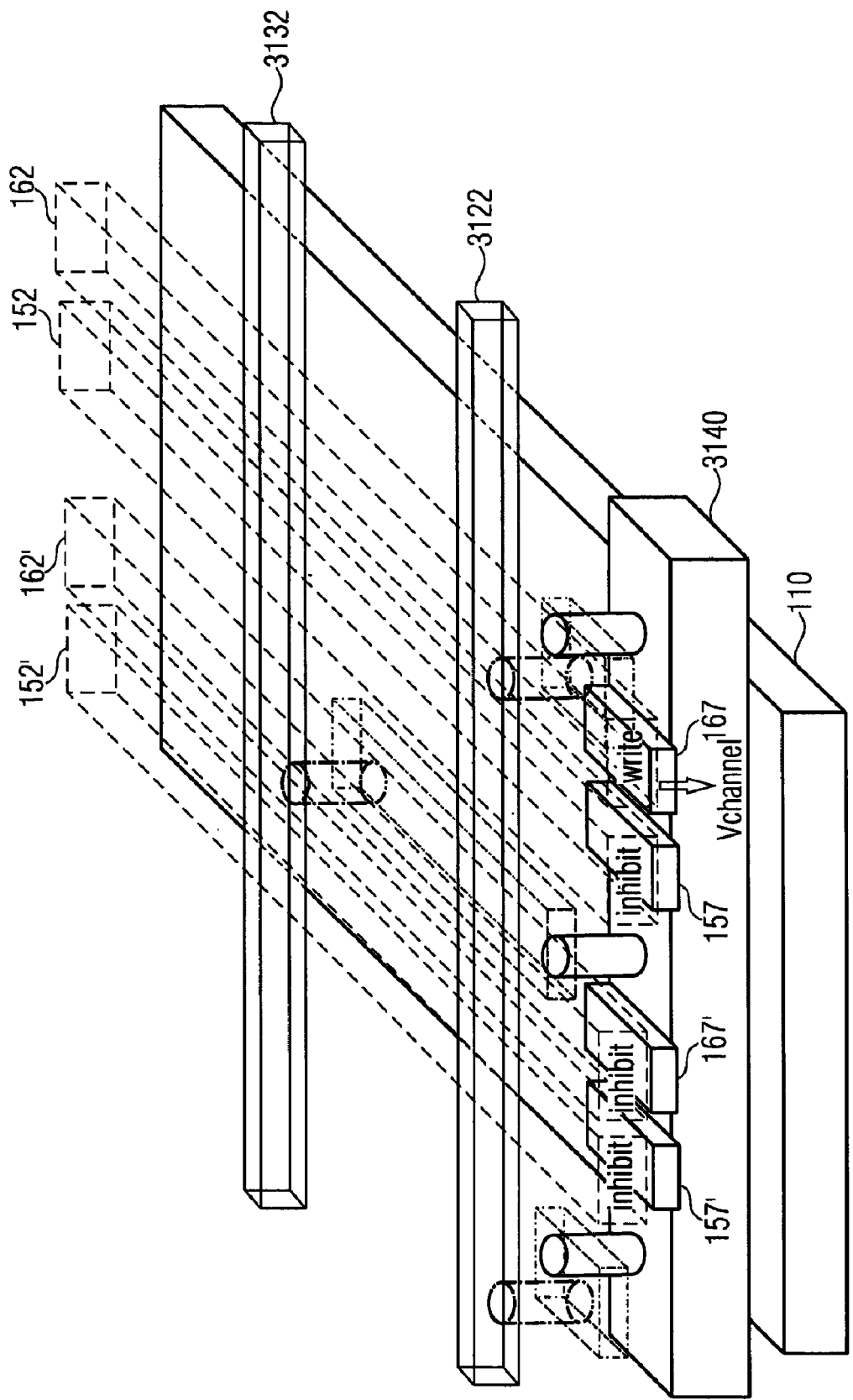
FIG. 4F shows a perspective view of an embodiment of a programmable memory device for writing a second programmable structure.

FIG. 4F shows the programming or writing of the second programmable structure 160 of the first semiconductor device within the programmable memory device. The operation corresponds to the one already discussed based on FIG. 2N. A write voltage Vwrite is applied to the second control structure 162 of the second programmable structure. The inhibit voltage Vinhibit is applied to the first control structure of the first programmable structure, and the control structures 152', 162' of the programmable structures of the second semiconductor device should prevent unintended programming of these programmable structures. The inhibit voltage Vinhibit is not as negative as the second bulk voltage Vbulk and not as positive as the write voltage Vwrite. Thus, no stress is applied to the first programmable structure and the programmable structures of the second semiconductor device, i.e., these programmable structures are not programmed. The voltage drop Voxide over the insulating structure 158 of the first programmable structure and the corresponding insulating structures of the programmable structures of the second semiconductor device is defined as: Voxide=Vinhibit−Vdata. Vdata is the voltage that is applied to the first and second bit lines 3122, 3132 and defines an information value to be stored in the second programmable structure. The voltage drop over the sidewall oxide, i.e., the insulating structure arranged between the first control structure 152 and the second control structure 162 of the first semiconductor device is defined as: Vsidewall=Vinhibit−Vwrite. The control structure or word line 162 of the programmable structure to be erased sees a high voltage drop over the tunnel oxide 168, the voltage drop Vtunnel being defined as: Vtunnel=Vwrite−Vdata. In case the inhibit voltage Vinhibit is applied as data voltage Vdata, i.e., Vdata=Vinhibit, the erase state of the second programmable structure is kept or maintained. In case a second bulk voltage Vbulk2 is applied as data voltage Vdata, i.e., Vdata=Vbulk, the second programmable structure 160 gets programmed, or in other words, a second information value gets stored in the second programmable structure 160. For the program operation, the bulk potential is negative. The arrow in FIG. 4F shows the effective tunneling. The voltage in the channel area Vchannel depends on the data voltage Vdata applied to the bit lines 3122, 3132.

Although embodiments of the semiconductor have been described that are adapted to store a first or second information value, further embodiments can be adapted to store more than two different information values. These are also referred to multi-level embodiments or cell structures. Such embodiments distinguish between multiple different charge thresholds and apply sequentially multiple different read voltages for reading the stored information values.

In the following, a three-level embodiment of the semiconductor device with an n-channel transistor structure, and a negative charge trapping structure is explained. For such a three-level embodiment, for example, an electrical charge with a magnitude below a given first charge threshold corresponds to a first information value, an electrical charge with a magnitude above the given first charge threshold and below a second charge threshold corresponds to a second information value, and an electrical charge with a magnitude above the given second charge threshold corresponds to a third information value. These embodiments are further adapted to apply during read-operations sequentially two different read voltages: a first and a second read voltage. The first read voltage Vread1 is defined such that in case a first information value (erased) is stored in the first programmable structure 150, the read voltage Vread is high enough to set the first section in a conductive state, and in case a second information value (programmed1) or third information value (programmed2) is stored in the first programmable structure 150, the read voltage Vread is small enough to retain the first section 142 in a blocking state. The second read voltage Vread2 is defined such that in case a first or second information value (erased, programmed1) is stored in the first programmable structure 150, the read voltage Vread2 is high enough to set the first section in a conductive state, and in case a third information value (programmed2) is stored in the first programmable structure 150, the read voltage Vread2 is small enough to retain the first section 142 in a blocking state. Thus by applying both read voltages sequentially, the first information value (erased) is detected or read in case the first section is only in a conductive state when the first read voltage (and not for the second read voltage) is applied, the second information value (programmed1) is detected or read in case the first section is only in a conductive state when the second read voltage (and not for the first read voltage) is applied, and the third information value (programmed2) is detected or read in case the first section is in a blocking state when both read voltages are applied.

Summarizing the aforementioned, embodiments of the semiconductor device and programmable memory device enable to conceive a flat optimized and cost-effective embedded non-volatile memory architecture (eNVM), which at the same time can have superior performance. The embedded non-volatile memory contains non-volatile data that must be read as quickly as possible and, by comparison with the reading, only needs to be written very slowly. Embodiments of the semiconductor device comprise two separate programmable transistors, which are arranged serially in a similar way as for NAND structures. Embodiments of the semiconductor device can therefore also be referred to as minimal NAND structures. Reading out from the cells can be effected in such a way that the programmable structure or cell to be bridged always sees a virtual "high" potential on the channel. This means, the cell stress for the cell to be bridged is minimized. Using a current source, a sense amplifier SA tends to pull the sense line to high. Its sense port is switched to the appropriate physical line, depending on the address. Other remaining lines, which are not connected to a sense amplifier, are pulled to ground voltage GND. An alternative embodiment for reading the programmable structures can be realized by using the same concept with a reverse polarization. In that case, the sense amplifier incorporates a current sink, and all array lines or bit lines that are not connected to a sense amplifier are connected to, for example, the supply voltage VDD. Here, the cell to be bridged is than not arranged between the sense amplifier and the cell to be read out, but between the supply voltage VDD feedline and the cell to be read out.

In embodiments of the semiconductor device the gate-disturb of the transistor to be bridged is particularly small, respectively always small in contrast to normal NAND structures. Thus, a higher cycle robustness or life cycle time can be achieved.

The serial arrangement of two storage cells averts the danger of leakage current due to an overerased cell. Sector-selection transistors that electrically disconnect, for example, sectors of 32 word lines from each other to reduce the problem of leakage currents become superfluous. Embodiments of the semiconductor device and programmable memory device can be implemented using only one negative pump and two positive pumps. Comparing the embodiments of the semiconductor device with known unified channel programming (UCP) cell architectures that require large overhead, for example, a 7-pump voltage system, pumps can be saved in a similar way as with the EEPROM architecture. Another major saving is the drain contacts in the cell array. For the same bit-array size, only half the drain-source contacts are required compared to the UPC cell array. Compared to known two-transistor cell EEPROM architectures comprising per programmable transistor one select transistor to avoid leakage currents, the array consumption for programmable read-only memory architectures can be decreased.

Furthermore, a read access, for example, requires two word lines or control structures to be set high using different voltages (a read voltage and a bridging voltage). The sense amplifier connection depends not only on the block address but also on the word line address.

Further embodiments of the semiconductor device comprise a controller 170, wherein the controller is adapted to apply a read voltage Vread to the control structure of the programmable structure to be read, a bridge voltage Vbridge to the control structure of the programmable structure to be bridged, a low voltage to the contact area connected to the section of the channel area associated to the programmable structure to be read and a high voltage to the contact area connected to the section associated to the programmable structure to be bridged, for reading the information value stored in the programmable structure to be read, wherein the high voltage is higher than the low voltage, wherein the read voltage is defined such that in case a first information value is stored in the programmable structure to be read, the section of the channel area associated to the programmable structure to be read is in a conductive state, and in case a second information value is stored in the programmable structure to be read, the section of the channel associated to the programmable structure to be read is in a blocking state, and wherein the bridge voltage is defined such that the section associated to the programmable structure to be bridged is in a conductive state irrespective of whether the first information value or the second information value is stored in the programmable structure to bridged.

Referring, for example, to FIGS. 2A and 2I, the first programmable structure 150 is the structure to be read, the second programmable structure 160 or other structure of the two programmable structures is the structure to be bridged. With regard to these two embodiments, FIG. 2A describes an embodiment comprising a sense amplifier with a current source, wherein the current source applies a given high voltage to the programmable structure 160 to be bridged, for example, the supply voltage VDD, and wherein the programmable structure 150 to be read is connected to a low voltage, for example, ground GND. FIG. 2I, on the other hand, describes an embodiment comprising a sense amplifier with a current sink, wherein the current sink applies a low voltage to the programmable structure 150 to be read, for example, ground GND, and wherein a high voltage, for example, the supply voltage VDD, is applied to the programmable structure 150 to be bridged.

In both embodiments, the controller is adapted to apply a read voltage Vread to the first control structure and a bridge voltage Vbridge to the second control structure, and to connect a sense amplifier to the first contact area 120 (see SA in FIG. 2I) or second contact area 130 (see SA in FIG. 2A) and a given voltage to the other respective contact area 130, 120 (see VDD connected to second contact area 130 in FIG. 2I, and GND connected to the first contact area 120 in FIG. 2A) for reading the information value stored in the first programmable structure, and to switch the application of the read voltage Vread and the bridge voltage Vbridge between the first control structure 152 and second control structure 162, and to switch the connection to the sense amplifier SA and the given voltage between the first and second contact area for reading the information value stored in the second programmable structure (see switched connections in FIG. 2B compared to FIG. 2A, and switched connections in FIG. 2F compared to FIG. 2E).

With regard to the aforementioned given voltage applied to the other respective contact area, the controller can be adapted to apply a low voltage to the other contact area when the sense amplifier comprises a current source, the current source on the other hand providing a high voltage (see FIGS. 2A, 2B), and to apply a high voltage to the other contact area when the sense amplifier comprises a current sink, the current sink providing on the other hand a low voltage (see FIGS. 2I, 2J), so that a high voltage to the contact area is associated to the programmable structure to be bridged (see FIGS. 2A, 2B and 2I, 2J) and a low voltage to the contact area associated to the programmable structure to be read, independent of whether the embodiment comprises a current source (FIGS. 2A, 2B) or current sink (FIGS. 2I, 2J). The first section 142 can be regarded as being associated with the first programmable structure 150 as its conductivity is controlled by the first programmable structure, and the second section 144 can be regarded as being associated with the second programmable structure 160 as its conductivity is controlled by the second programmable structure.

In other words, for embodiments with a current source (see FIGS. 2A, 2B) the controller is adapted to always apply the high voltage, e.g., of the current source, to the programmable structure to be bridged by switching not only the read and bridge voltage connections when switching to read the other of the two programmable structures but also the contact area connections. In a similar way, for embodiments with a current sink (see FIGS. 2I, 2J) the controller is adapted to always apply the high voltage, e.g., a power supply voltage VDD, to the programmable structure to be bridged by switching not only the read and bridge voltage connections for reading the other of the two programmable structures but also the contact area connections.

The aforementioned switching of the connections of the contact areas respectively of the read lines together with the switching of the read and bridge voltages and the capability to, thus, always apply a high voltage to the programmable structure to be bridged, reduces the stress exerted to the programmable structures to be bridged and, thus, increases the cycle life of the programmable structure itself and of the overall semiconductor device.

Depending on certain implementation requirements of the inventive methods, the inventive methods can be implemented in hardware or in software. The implementation can be performed using a digital storage medium, in particular, a disk, a CD or a DVD having an electronically-readable control signal stored thereon, which cooperates with a programmable computer system such that an embodiment of the inventive method is performed. Generally, an embodiment of the present invention is therefore a computer program produced with a program code stored on a machine-readable carrier, the program code being operative for performing the inventive method when the computer program product runs on a computer. In other words, embodiments of the inventive method are therefore a computer program having a program code for performing at least one of the inventive methods when the computer program runs on a computer.

The foregoing was particularly shown and described with reference to particular embodiments thereof. It will be understood by those skilled in the art that various other changes in the form and details may be made without departing from the spirit and scope thereof. It is therefore to be understood that various changes may be made in adapting the different embodiments without departing from the broader concept disclosed herein and comprehended by the claims that follow.

What is claimed is:

1. A semiconductor device, comprising:
   a channel area arranged in a semiconductor substrate between a first contact area and a second contact area;
   a first programmable structure comprising a first control structure, the first programmable structure being arranged such that a conductivity of a first section of the channel area depends on a voltage applied to the first control structure of the first programmable structure and on an information value stored in the first programmable structure; and
   a second programmable structure, comprising a second control structure, the second programmable structure being arranged such that a conductivity of a second section of the channel area depends on a voltage applied to the second control structure of the second programmable structure and on an information value stored in the second programmable structure,
   wherein the first section and the second section of the channel area are electrically connected in series between the first contact area and the second contact area.

2. The semiconductor device of claim 1, further comprising a first read line and a second read line, wherein the first contact area of the semiconductor device is electrically connected to the first read line, and wherein the second contact area of the semiconductor device is electrically connected to the second read line.

3. The semiconductor device of claim 1, wherein the first control structure is connectable to a different voltage than the second control structure.

4. The semiconductor device of claim 1, further comprising:
   a controller adapted to apply a voltage to the first control structure and the second control structure.

5. The semiconductor device of claim 4, wherein the controller is adapted to apply a read voltage to the first control structure and a bridge voltage to the second control structure to enable a reading of the information value stored in the first programmable structure,
   wherein the read voltage is defined such that in case a first information value is stored in the first programmable structure, the first section is in a conductive state, and in case a second information value is stored in the first programmable structure, the first section is in a blocking state, and
   wherein the bridge voltage is defined such that the second section is in a conductive state irrespective of whether the first information value or the second information value is stored in the second programmable structure.

6. The semiconductor device of claim 4, wherein the controller is adapted to apply a read voltage to the second control structure and a bridge voltage to the first control structure to enable a reading of the information value stored in the second programmable structure,
   wherein the read voltage is defined such that in case a first information value is stored in the second programmable structure, the second section is in a conductive state, and in case a second information value is stored in the second programmable structure, the second section is in a blocking state, and
   wherein the bridge voltage is defined such that the first section is in a conductive state irrespective of whether the first information value or the second information value is stored in the first programmable structure.

7. The semiconductor device of claim 4, further comprising:
   a sense amplifier comprising a current source, the sense amplifier coupled to the controller.

8. The semiconductor device of claim 7, wherein the sense amplifier is adapted to measure a voltage level of the second contact area to read the information value stored in the first programmable structure; and
   wherein the controller is adapted to connect the second contact area to the current source of the sense amplifier and to connect the first contact area to a predetermined voltage, such that in case the first section and the second section are in a conductive state, the voltage level at the second contact area is pulled down below a given threshold.

9. The semiconductor device of claim 7, wherein the sense amplifier is adapted to measure a voltage level of the first contact area to read the information value stored in the second programmable structure; and
   wherein the controller is adapted to connect the first contact area to the current source of the sense amplifier and to connect the second contact area to the predetermined voltage, such that in case the first section and the second section are in a conductive state, the voltage level at the first contact area is pulled down below a given threshold.

10. The semiconductor device of claim 4 further comprising:
a sense amplifier comprising a current sink, the sense amplifier being coupled to the controller.

11. The semiconductor device of claim 10, wherein the sense amplifier is adapted to measure a voltage level of the first contact area to read the information value stored in the first programmable structure, and
wherein the controller is adapted to connect the second contact area with a further predetermined voltage and to connect the first contact area with the current sink, such that in case the first section and the second section are in a conductive state, the voltage level at the first contact area is pulled up above a given threshold.

12. The semiconductor device of claim 10, wherein the sense amplifier is adapted to measure a voltage level of the second contact area to read the information value stored in the second programmable structure, and
wherein the controller is adapted to connect the first contact area with a further predetermined voltage and to connect the second contact area with the current sink, such that in case the first section and the second section are in a conductive state, the voltage level at the second contact area is pulled up above a given threshold.

13. The semiconductor device of claim 4, wherein the controller is adapted to apply a read voltage to the first control structure and a bridge voltage to the second control structure, and to connect a sense amplifier to the first or second contact areas and a given voltage to the other contact area for reading the information value stored in the first programmable structure, and to switch an application of the read voltage and bridge voltage between the first and the second control structure, and to switch a connection to the sense amplifier and to the given voltage between the first and second contact areas for reading the information value stored in the second programmable structure.

14. The semiconductor device of claim 13, wherein the controller is adapted to connect always a high voltage to the contact area associated to the programmable structure to be bridged and a low voltage to the contact area associated to the programmable structure to be read.

15. The semiconductor device of claim 1, wherein the first programmable structure and the second programmable structure are erasable and programmable structures adapted to store an electrical charge, wherein an electrical charge with a magnitude below a given threshold corresponds to a first information value, and wherein an electrical charge with a magnitude above the given threshold corresponds to a second information value.

16. The semiconductor device of claim 15, wherein the first programmable structure comprises a first floating gate, the first floating gate being arranged between a first control gate and the first section and being electrically insulated.

17. The semiconductor device of claim 16, wherein the second programmable structure comprises a second floating gate, wherein the second floating gate is arranged between a second control gate and the second section and being electrically insulated.

18. The semiconductor device of claim 16, further comprising:
a controller adapted to apply a write voltage to the first control structure, and an inhibit voltage to the second control structure and a further voltage to the channel area to store the second information value in the first programmable structure,
wherein a voltage difference between the further voltage and the write voltage is large enough to store the second information value in the first programmable structure, and wherein the voltage difference between the further voltage and the inhibit voltage is small enough to maintain the information value stored in the second programmable structure.

19. The semiconductor device of claim 16, further comprising:
a controller adapted to apply an erase voltage to the first control structure, an inhibit voltage to the second control structure and a bulk voltage to a bulk area to store the first information value in the first programmable structure;
wherein a voltage difference between the bulk voltage and the erase voltage is large enough to store the first information value in the first programmable structure, and
wherein the voltage difference between the bulk voltage and the inhibit voltage is small enough to maintain the information value in the second programmable structure.

20. A programmable memory device, comprising:
a plurality of semiconductor devices, each semiconductor device comprising:
a channel area arranged in a semiconductor substrate between a first contact area and a second contact area;
a first programmable structure comprising a first control structure, the first programmable structure being arranged such that a conductivity of a first section of the channel area depends on a voltage applicable to the first control structure of the first programmable structure and on an information value stored in the first programmable structure; and
a second programmable structure, comprising a second control structure, the second programmable structure being arranged such that a conductivity of a second section of the channel area depends on a voltage applicable to the second control structure of the second programmable structure and an information value stored in the second programmable structure,
wherein the first section and the second section of the channel area are electrically connected in series between the first contact area and the second contact area; and
a first read line and a second read line;
wherein the first contact area of each semiconductor device of the plurality of semiconductor devices is electrically connected to the first read line, and
wherein the second contact area of each semiconductor device of the plurality of semiconductor devices is electrically connected to the second read line, and
wherein the channel area of each semiconductor device of the plurality of semiconductor devices are arranged in the same semiconductor substrate.

21. The programmable memory device of claim 20, wherein the read lines comprise bit lines.

22. The programmable memory device of claim 20, further comprising:
a further plurality of semiconductor devices, each semiconductor device comprising:
a channel area arranged in a semiconductor substrate between a first contact area and a second contact area;
a first programmable structure comprising a first control structure, the first programmable structure being arranged such that a conductivity of a first section of the channel area depends on a voltage applicable to the first control structure of the first programmable structure and on an information value stored in the first programmable structure; and a second programmable structure, comprising a second control structure, the second programmable structure being arranged such that a conductivity of a second section of the channel area depends on a voltage applicable to the second control structure of the second programmable structure and an information value stored in the second programmable structure, wherein the first section and the second section of the channel area are electrically connected in series between the first contact area and the second contact area; and a third read line and a fourth read line;

wherein the first contact areas of each semiconductor device of the further plurality of semiconductor devices are electrically connected to the third read line, and wherein the second contact area of each semiconductor device of the further plurality of semiconductor devices are electrically connected to the fourth read line; and at least one common first control structure and one common second control structure, wherein the common first control structure forms the first control structure of the first programmable structure of a semiconductor device of the plurality of semiconductor devices and of a semiconductor device of the further plurality of semiconductor devices, and wherein the common second control structure forms the second control structure for the second programmable structure of the semiconductor device of the plurality of semiconductor devices and of the semiconductor device of the further plurality of semiconductor devices, and wherein the channel area of each semiconductor device of the further plurality of semiconductor devices is arranged in the same semiconductor substrate as the channel area of each semiconductor device of the plurality of semiconductor devices.

23. A method of producing a semiconductor device, the method comprising:

providing a semiconductor substrate;

forming a first contact area, a second contact area and a channel area in the semiconductor substrate between the first contact area and the second contact area;

forming a first programmable structure comprising a first control structure, the first programmable structure being arranged such that a conductivity of a first section of the channel area depends on a voltage applicable to the first control structure of the first programmable structure and on a charge value stored in the first programmable structure; and forming a second programmable structure, comprising a second control structure, the second programmable structure being arranged such that a conductivity of a second section of the channel area depends on a voltage applicable to the second control structure of the second programmable structure, and on a charge value stored in the second programmable structure, wherein the first section and the second section are electrically connected in series between the first contact area and the second contact area.

24. A method of using a semiconductor device, the semiconductor device comprising:

a channel area arranged in a semiconductor substrate between a first contact area and a second contact area;

a first programmable structure comprising a first control structure, the first programmable structure being arranged such that a conductivity of a first section of the channel area depends on a voltage applicable to the first control structure of the first programmable structure and on an information value stored in the first programmable structure; and a second programmable structure, comprising a second control structure, the second programmable structure being arranged such that a conductivity of a second section of the channel area depends on a voltage applicable to the second control structure of the second programmable structure and on an information value stored in the second programmable structure, wherein the first section and the second section of the channel area are electrically connected in series between the first contact area and the second contact area, the method comprising:

applying a read voltage to the first control structure and a bridge voltage to the second control structure, and connecting a sense amplifier to the first or second contact area and a given voltage to the other contact area for reading the information value stored in the first programmable structure, and switching the application of the read voltage and bridge voltage between the first and the second control structure, and switching a connection to the sense amplifier and to the given voltage between the first and second contact area for reading the information value stored in the second programmable structure.

25. The method according to claim 24, wherein the method comprises always connecting a high voltage to the contact area associated to the programmable structure to be bridged and a low voltage to the contact area associated to the programmable structure to be read.

* * * * *